United States Patent
Izawa et al.

(10) Patent No.: US 6,842,658 B2
(45) Date of Patent: Jan. 11, 2005

(54) METHOD OF MANUFACTURING A SEMICONDUCTOR DEVICE AND MANUFACTURING SYSTEM

(75) Inventors: Masaru Izawa, Hino (JP); Masahito Mori, Hachioji (JP); Nobuyuki Negishi, Kokubunji (JP); Shinichi Tachi, Sayama (JP)

(73) Assignee: Hitachi, Ltd., Tokyo (JP)

( * ) Notice: Subject to any disclaimer, the term of this patent is extended or adjusted under 35 U.S.C. 154(b) by 135 days.

(21) Appl. No.: 09/791,666

(22) Filed: Feb. 26, 2001

(65) Prior Publication Data

US 2002/0103563 A1 Aug. 1, 2002

(30) Foreign Application Priority Data

Feb. 1, 2001 (JP) ........................................ 2001-025171

(51) Int. Cl.⁷ .............................................. G06F 19/00
(52) U.S. Cl. ........................ 700/121; 700/96; 216/59; 438/9; 438/14
(58) Field of Search ............................. 216/59, 60, 61, 216/83, 84, 85; 438/9, 14, 15, 5; 700/96, 121, 108, 109, 110; 156/345.13, 345.15

(56) References Cited

U.S. PATENT DOCUMENTS

| | | | | |
|---|---|---|---|---|
| 4,350,563 A | * | 9/1982 | Takada et al. | 438/694 |
| 5,450,205 A | * | 9/1995 | Sawin et al. | 356/632 |
| 5,497,331 A | * | 3/1996 | Iriki et al. | 700/121 |
| 5,576,629 A | * | 11/1996 | Turner et al. | 324/709 |
| 6,313,012 B1 | * | 11/2001 | Horiuchi et al. | 438/459 |
| 6,363,294 B1 | * | 3/2002 | Coronel et al. | 700/121 |
| 6,391,789 B2 | * | 5/2002 | Sango | 438/714 |
| 6,406,924 B1 | * | 6/2002 | Grimbergen et al. | 438/9 |
| 2002/0069349 A1 | * | 6/2002 | Toprac | 712/224 |
| 2002/0183885 A1 | * | 12/2002 | Goder et al. | 700/121 |

* cited by examiner

Primary Examiner—Leo Picard
Assistant Examiner—Carlos R. Ortiz
(74) Attorney, Agent, or Firm—Antonelli, Terry, Stout & Kraus, LLP

(57) ABSTRACT

Automatic generation of processing conditions will be provided, based on a database and process modeling by a computer equipped in semiconductor device fabrication equipment, by using input of wafer processing history including the thickness and quality. The computer equipped in semiconductor device fabrication equipment obtains the wafer processing and inspection results from a production line management computer in order to assist input of the process history. The computer in the fabrication equipment can be connected to computers in a fabrication equipment manufacturer on a communication network to automatically provide process conditions and maintenance schedule.

6 Claims, 13 Drawing Sheets

METHOD OF MANUFACTURING A SEMICONDUCTOR DEVICE AND MANUFACTURING SYSTEM

BACKGROUND OF THE INVENTION

1. Field of the Invention

The present invention relates to a method of manufacturing a semiconductor device and manufacturing system.

2. Description of the Prior Art

Semiconductor devices are produced by the fabrication process in combination of ion implantation, film deposition by means of sputtering equipment or CVD (chemical vapor deposition) equipment, transcription for delineating a mask pattern on a resist mask by exposing and developing, thin film process by etch, and washing/rinse. Each semiconductor device manufacturing equipment is handled as a separate machine. The process conditions in each equipment have been optimized for that single equipment, in most cases. More specifically, each of process engineers decides such process conditions as kind of feeding gas, gas flow rate, gas pressure, output power of high frequency waves, processing time, processing temperature, processing stage position, and the like on the basis of wafer process information and his/her empirical knowledge and performs many trial and error in order to optimize the conditions.

In one semiconductor fabrication process, the same semiconductor fabrication equipment such as including film deposition equipment and etching equipment are used in the production of prototype samples and in the production of final products, so that the specifications of prototype samples provided for the optimization of process conditions should be almost identical to those in the mass production. The optimum process conditions suitable for the final semiconductor devices are determined by using these prototypes.

Accordingly, for different final product devices, different process conditions corresponding thereto are required to be defined. For instance, in dry etching equipment for processing gate electrodes, the optimum process conditions may be varied depending on the deposition condition of polysilicon. This means that even a small change of the amount of impurity doping for the polysilicon or the ingredients of feeding gases in the deposition equipment requires to start over a totally renewed optimization of the etching conditions.

In the optimization of process conditions using the prototype samples, the period of time needed for the development of a new process and the number of wafers to be used will be different, depending on the ability of process engineers in charge. In particular, tens of wafers for the prototyping may be consumed, and a couple of weeks may be needed for one insufficiently skilled in the art. For a mass production of single product, the cost and period of development may not be a critical matter. However, for a production of small amount and variety of products, and if the wafer radius becomes larger, the development cost of process will occupy a correspondingly larger proportion of the total cost of the final product, resulting in a weaken competitiveness of the semiconductor device product.

In the deposition and dry etching equipment, the condition of inner wall surface of the equipment will be aged (fluctuations in the long-term running) by the sticked deposits and etching. The sufficient control of the processing time is indispensable and the exchange of expendable supplies together with the lavage of inner wall surface should be performed routinely. Since the inner wall of equipment is gradually and continuously changes of the behavior along with the total processing time, there may be a slight difference in the film thickness and the characteristics of the thin film made by the deposition equipment, also in the shape and selectivity of masks in the etching equipment when compared between the initial state (immediately after the lavage) and used stage (immediately before the next lavage). In particular, when processing a contact hole with a higher aspect ratio, there is likely occurred defects due to unopening (contact defects) just before the lavage. The margin of opening must be maintained even when sacrificing the mask selectivity.

In a semiconductor fabrication line, there are inspection apparatuses everywhere for detecting any defects of semiconductor devices and feeding back the information thereon to the fabrication equipment. For instance, in case of a defective contact of etching, part of wafer having been etched will be picked up to examine on a SEM (scanning electron microscope). Based on the information obtained from the inspection, etching conditions and lavage conditions will be considered again revising in order to improve the mass productivity of the semiconductor devices.

As another example in the semiconductor fabrication equipment for accelerating the response to a troublesome problem in exposure equipment, by connecting the computer in the semiconductor fabrication line to the exposure equipment vendor by networking the computer equipped in the exposing apparatus with the computer in the semiconductor fabrication line, there are disclosed Japanese Patent Application Laid-Open No. Hei 11-15520 and No. Hei 10-97966. As still another example, a system for performing fine tuning of exposure conditions in correspondence with the disparity between equipment is disclosed in the Japanese Patent Application Laid-Open No. 2000-100720.

In the Prior Art, since data is not shared among semiconductor fabrication equipment, process conditions must be optimized for each of mask patterns. Process conditions such as gas flow rate, pressure, input electric field power, processing temperature and the like may be determined almost unique from the wafer specification (the contents of processing in the preceding stages) and the accuracy of critical dimension control. When optimizing the processes, the process engineers in charge have to know well the correlation between the optimum conditions and the preceding processes up to that just before. However, the correlation to the preceding processes is not always clearly stated for the process engineers, so that the optimization of conditions has been achieved only by the trial and error method. This make it difficult to quickly accommodate to the processes for new semiconductor devices.

Fluctuations in the long term running of the fabrication equipment has been remedied by using such condition as that at the cost of selectivity and throughput, for the sake of prevent defects caused by the fluctuations in the long term running from being concluded. For example, in the process of contact holes, the openings is kept at the cost of mask selectivity. In a finer process where the resist mask becomes thinner, the process of deeper and finer holes will be difficult.

When finding a defect in the inspection means such as the inspection SEM and the like, the countermeasure to the defective product is the business of the process engineer in charge. The feedback of inspection result to the process condition may require long time, because the comprehension of the process in the preceding stages, experience, and very detailed analysis of the data are prerequisite even for one skilled in the process.

In the conventional mass production lines, the inspection result of a preceding stage is not reflected to the stage that follows. For instance, in case of the gate etching, the distribution control in correspondence with the thickness distribution of polycrystalline Si is not feasible, so that the amount to be etched in one plane may vary, and the underlaying oxide layer may be etched where the film thickness of polysilicon is thinner, causing a defective product. When making a contact hole, it is difficult to control the distribution by the etching equipment so as to accommodate to the aging fluctuations in the long term running on the distribution of the film thickness of the oxide layer.

SUMMARY OF THE INVENTION

The present invention has been made in view of the above circumstances and has an object to overcome the above problems and to provide a method of manufacturing semiconductor devices and a manufacturing system for the same, which achieves the improved yield and the improved throughput by implementing the automatic generation of processing conditions and the unified management of semiconductor fabrication equipment in the semiconductor device manufacturing.

In a semiconductor fabrication process, the process history up to the preceding process (for example, such processes as film deposition process of polysilicon, exposure and development and the like, in case of gate etching) and the required accuracy of critical dimension control may determine uniquely most of the process conditions. It is needless to say that the process conditions may fall into a slack range when requiring an accuracy of critical dimension control not so severe. For example, in etching equipment, the complex procedure of ordinary process development will be aided to be mitigated by automatically configuring the etching condition from the input of wafer information including the preliminary treatment.

The process contents (history) and inspection result up to the process just before may be entered to the equipment. However, it is also conceivable to build a communication network system among equipment so as for a computer in process equipment to obtain any information needed. The automatic determination of process conditions may be achieved by the access to a process database or a process modeling. The database or modeling can be available or obtained from the manufacturer of the fabrication equipment, since the process development is primarily conducted by the manufacturer. If there is not an optimum condition available, the engineers will seek and determine the optimum one based on some conditions appropriately approximating in the database. In most cases, the process development by the manufacturers may be far more advanced and the fine tuning of process conditions will be suffice. The cutting edge of the process development is conducted by the fabrication equipment manufacturers because the semiconductor device manufacturers or the semiconductor foundries select equipment on the basis of the processing performance.

In the database as have been described above, data including the wafer specification, the fluctuation of specification in the history, fluctuation of process conditions and the like is stored. More specifically, for example in case of the gate etching, the etching rate, processing shape, undercut and the like are stored as data for a variety of cases where vary such conditions as the wafer diameter, the surface area to be etched, the mask material, the amount of dosage, the annealing temperature, the kind of feeding gases, the procedure of doping, as well as the gas flow rate, the gas pressure, the high frequency wave power, and the processing temperature. The discrete data dispersion can be completed by interpolation. For an interpolating means, an optimized function or differential value may be used for the prediction.

In case of the gate etching, information on the depositing condition of the polysilicon, the inspection result of polysilicon (distribution of thickness) and the like will be obtained from each processing equipment through the network among equipment. The history of the wafer to be etched can be referred to with the lot number because production lot is managed by its number. If such information as the surface area to be etched or the mask material is not quite available from the appropriate equipment, then the information can be alternatively obtained via the computer of production management or via the computer in charge of mask design. The definitive etching conditions can be delivered to the computer in the etching equipment from the database used in the development or from the numerical modeling. If the database or modeling is not complete then the conditions can be determined by connecting to a host computer in the fabrication equipment manufacturer. The connection to the manufacturer uses an open line so that the access has to be under the control by encrypting the connection with a key code. The connection will be much secure with a proprietary line.

The fabrication equipment for semiconductor devices have the condition of the inner wall vary (fluctuation in the long term running) together with the increase of the number of wafers processed. This may affect the subtility of the processing shape, etching rate, deposition rate, as well as the distribution of deposition. This is caused by the gas penetration and exit into and from the inner wall. For instance, in case of the contact hole etching, the etching gas is depositive so that deposits will be accumulated on the inner wall. Since the depositing rate may be slowed down as the thickness of deposit layer on the inner wall is growing, the ratio of depositive gas will become significant in the plasma along with the number of wafers processed. As a consequence the processing shape may become tapered or unopened, causing defective contacts.

Although it is considered that the fluctuations in the long term running can be suppressed by modifying some processing conditions along with the increase of the processed number of wafers, the guideline of quantitative modification of the processing conditions is not quite definitively clear. The degree of fluctuation can be estimated by observing the condition of the inner wall by means of optical emission data or interferometry data. For instance, in case of the contact hole etching, the fluctuation can be suppressed by observing the ratio of the optical emission spectrum of C2 to the optical emission spectrum of O to increase the $O_2$ flow rate in correspondence with the increase of the intensity ratio of optical emission lines C2/O. Alternatively, another measure for suppressing the fluctuations in the long term running is to clean up the inner wall surface with $O_2$ plasma. However the optimum cleaning condition must be established because an extreme cleaning may cause the deposit to peel off from the wall surface to develop particles.

There is not sufficient data for the shifting process conditions in correspondence with the fluctuations in the long-term running, indeed. For the finer semiconductor devices required is the more accurate and precise control.

A plurality of mass production lines is in operation in one semiconductor device manufacturer, while data with respect to the dependency of the process conditions (for example, gas flow rate dependency of the process shape) is in the fabrication equipment manufacturer. For the sake of illustration, an etching process of high aspect ratio contact holes (HARC) will be cited below by way of example. In a mass production line, the analysis of defective contact by means of an inspection SEM, and confirmation of operation of the products by means of a multimeter. The defect in a high aspect ratio contact hole may be a short circuit with an adjacent hole, caused by unopened hole and low mask selection ratio. When the $O_2$ flow rate is high, There may not be an unopened hole, however the selection ratio may decrease and the short margin may also decrease.

In this situation, the computer associated with the etching equipment will attempt to obtain the inspection result in the mass production line to compare it with the database in the fabrication equipment manufacturer in order to estimate the degree of fluctuation of the etching conditions such that the maximum yield thereof can be achieved. Furthermore, this allows the correlation between the yield and the data from the optical emission spectra and the interferometry. By using the measurement data, the estimation can be applied to any other mass production lines regardless of the difference between equipment.

In addition to the inter-equipment network, an inter-line network can be built which is connected to the management center to facilitate the unified management of equipment in one process. When outsourcing this unified management of process equipment to the manufacturer of semiconductor fabrication equipment, the process engineers in charge of processes in the semiconductor device production lines will not be necessary. For example, a scheme can be drawn in which the unified management of etching equipment is realized by the manufacturer of those etching equipment, and the unified management of depositing equipment is performed by the manufacturer of those depositing equipment.

The unified management by the equipment manufacturer may also provides such services as the refill of expendables and the cleaning of the inside of equipment, allowing to reduce the specialized personnel that has been required for the stock management and the equipment lavage in the semiconductor device manufacturer.

As can be appreciated from the foregoing description, networking the equipment between semiconductor device production lines, implementing the intelligence in the process equipment, and disclosing the process databases and numerical modelings of the manufacturer of semiconductor device fabrication equipment may result in the improvement of the yield of semiconductor devices faster than ever, together with the curtailment of labor, cost, and time of process engineers who have to accumulate a lot of experiences and information.

As an exemplary topology of the inter-equipment network, there is the centralized management by a single host computer of process data and inspection data. In this case, the system relies on the management and disclosure of information by the semiconductor device manufacturer, so that the maintenance and assistance by the fabrication equipment manufacturers may be difficult to integrate. For example, when implementing the unified management of the fabrication equipment as have been described above, the access to the computer of centralized control owned by the device manufacturer is indispensable, may cause a difficulty in the management of the management computer itself. In addition the update of the data processing system in this case may not be easy. In contrast, when implementing the distributed data management, the equipment manufacturer needs only to access the equipment made by that manufacturer, allowing a simpler management scheme.

The above and further objects and novel features of the present invention will more fully appear from following detailed description when the same is read in connection with the accompanying drawings. It is to be expressly understood, however, the drawings are for the purpose of illustration only and not intended as a definition of the limits of the present invention.

DETAILED DESCRIPTION OF THE PREFERRED EMBODIMENTS

A detailed description of one preferred embodiment embodying the present invention will now be given referring to the accompanying drawings.

[First Embodiment]

Figure 1:
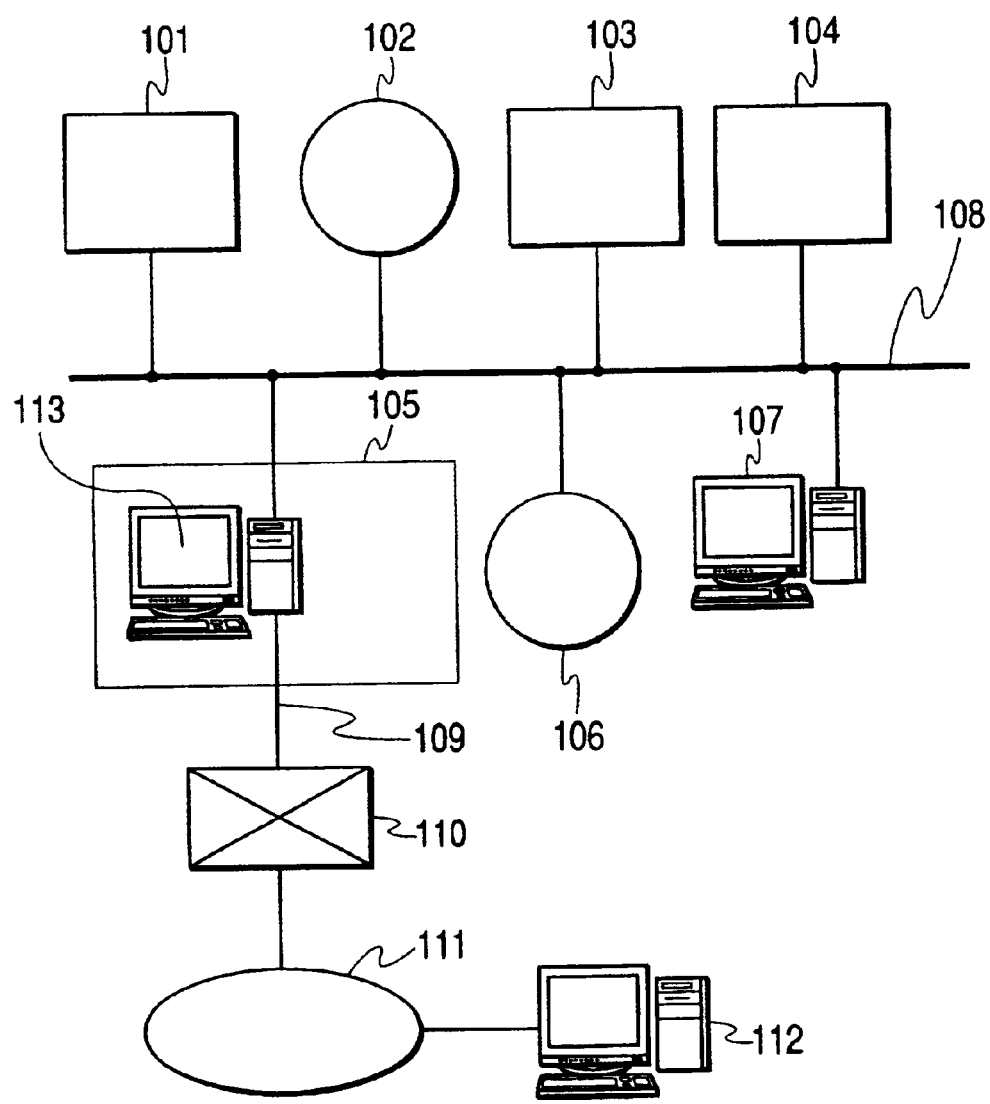
FIG. 1 is a schematic diagram of a network of semiconductor device production line connecting the fabrication equipment to the outside, used in the present invention.

A first preferred embodiment will be described in greater details herein below by referring to FIG. 1, which shows part of a production line of semiconductor devices in accordance with the present invention for use with a network.

Figure 2:
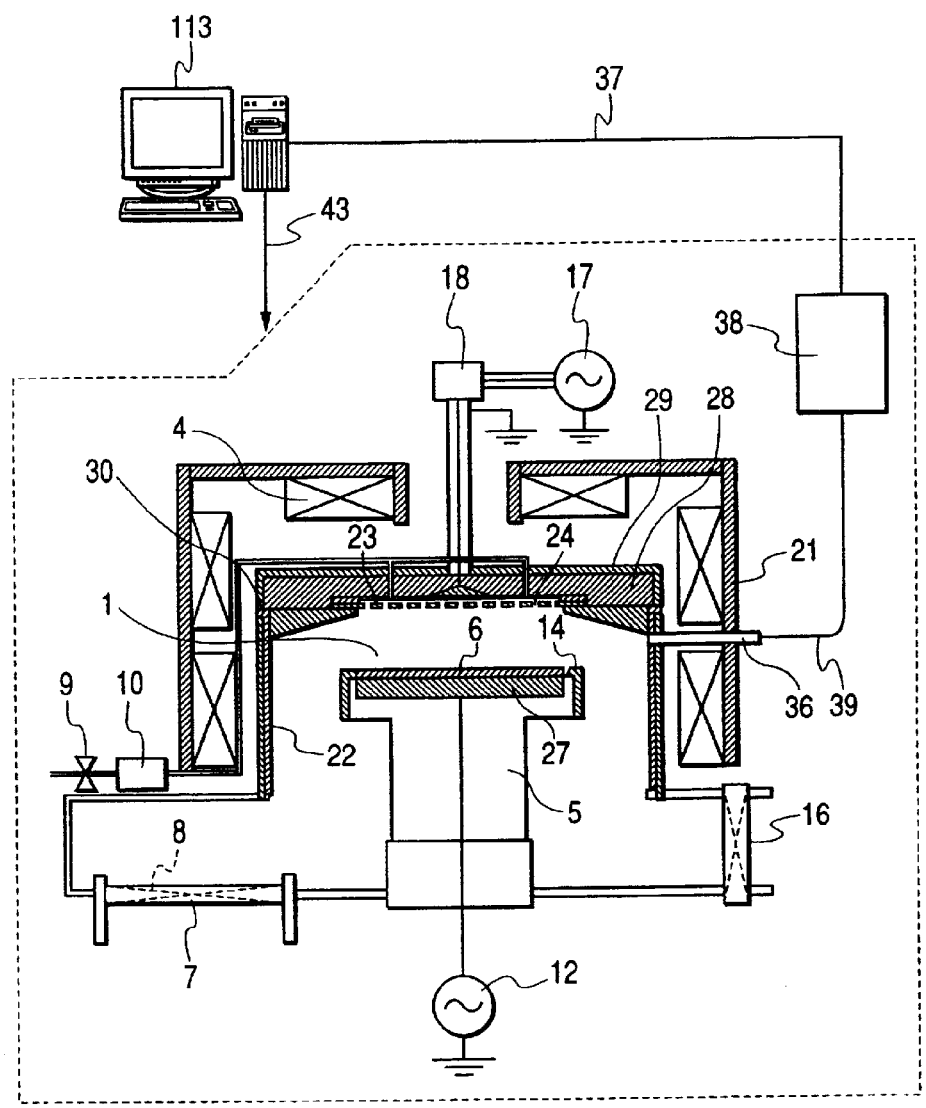
FIG. 2 is a schematic diagram of a cross-sectional view of oxide etching equipment used in the present invention and the connection thereof to the management computer.
Figure 3:
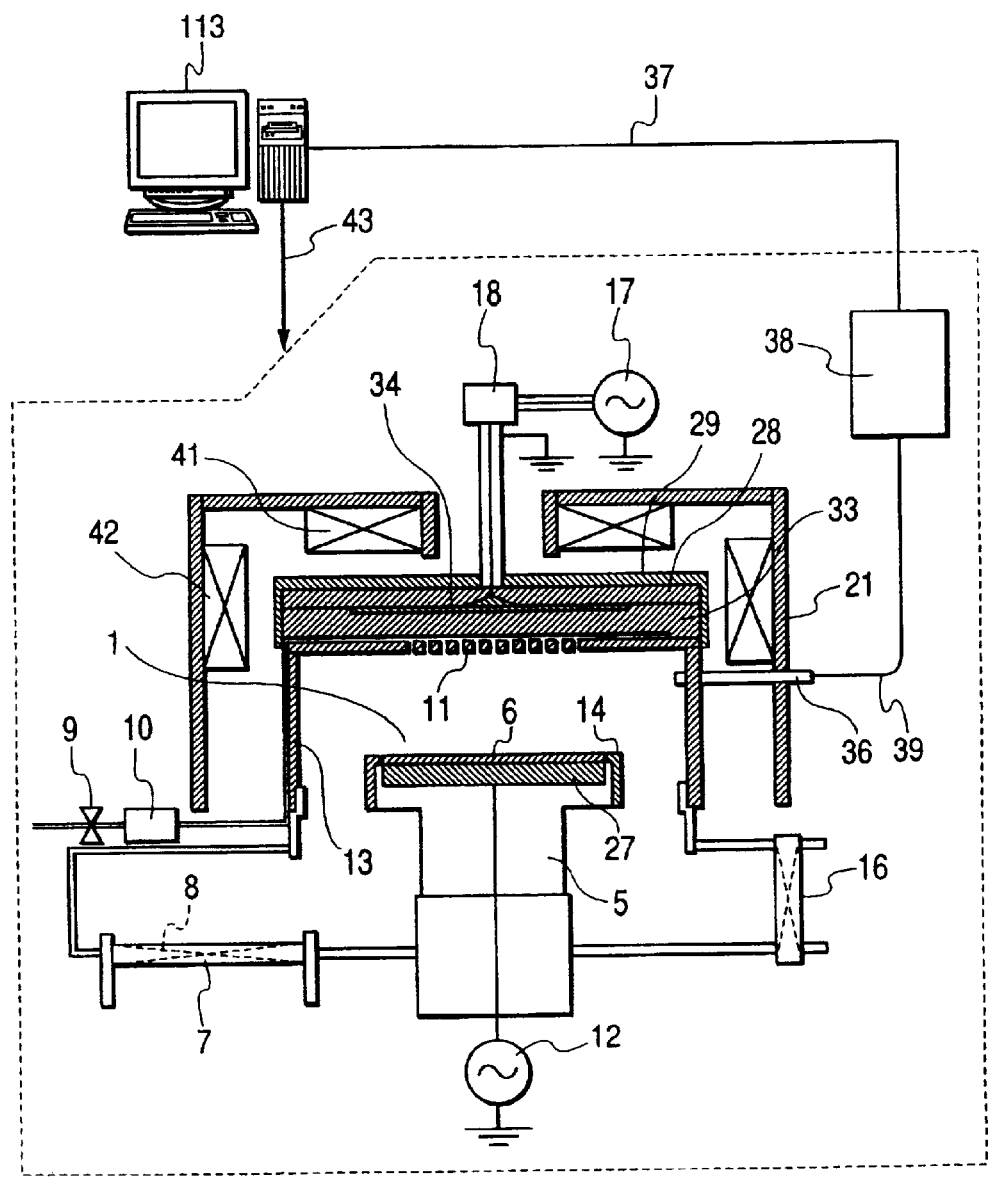
FIG. 3 is a schematic diagram of a cross-sectional view of etching equipment used in the present invention and the connection thereof to a management computer.

The processing wafer will be carried on a transporter robot and transported from polysilicon deposition equipment 101, through $SiO_2$ layer deposition equipment 103, exposure and development equipment 104 to etching equipment 105. The etching equipment 105 has an oxide processing unit as shown in FIG. 2, and a gate processing unit as shown in FIG. 3. The etching equipment 105 also has one washing chamber and a computer 113 for controlling the equipment.

A washing process is installed after the deposition equipment and the etching equipment. Some wafers will be transported to the thickness interferometer 102 and to the scanning electron microscope 106 for the inspection. The information on masks (such as the surface area subject to be etched, critical dimension and so on), processing history, lot number, processing schedule, information on the lot control (process flow of the lot) and the like are stored in a line management computer 107.

The equipment is TCP/IP connected on an Ethernet network 108 to enable data communication with other equipment. The lot number of wafers to be processed on these equipment may be indicated by the bar code on the case housing a plurality of wafers therein. The bar code will be automatically read out and entered to the computer incorporated in equipment, which in turn will communicate with the line management computer 107 to broadcast to every computers in the equipment the information on the wafer history and so on. The line management computer 107 has its own schedule of lot processing, through which equipment in the line can obtain the information on a lot that is not arrived yet (In this context, a "lot" is a set of about a dozen to 25 wafers).

FIG. 2 shows an oxide processing unit in the etching equipment 105. The unit is connected to the computer 113 through a line 43. A wafer 6 (the subject to be processed), in a metallic vacuum chamber 30, will be carried in through a transporter gate valve 16 and placed on an Al electrode 27 provided for applying high frequency waves to the wafer 6. On the Al electrode 27 an electrostatic attraction film made of ceramics is mounted for tightly contacting with the wafer 6. He gas will be fed to the space between the wafer and the electrostatic attraction film for controlling the wafer temperature. The Al electrode 27 is movable in the vertical direction and will be moved to a given height toward a plane antenna 23. In the Al electrode the refrigerant is circulated to maintain the temperature at a certain level. The Al electrode 27 has a facility for applying direct current electric field to tightly attract the wafer to the electrostatic attraction film with the electrostatic force.

Then etching gas will be introduced. The etching gas will be fed from a conductance valve 9 through a gas flow controller 10 for adjusting the flow rate and through a gas inlet 24 provided on the plane antenna 23 into the plasma processing chamber 1 (in this example, the oxide processing chamber). When a plurality of kinds of etching gas is used, each kind of gas will be introduced to a respective gas flow rate controller provided one for each, a plurality of gases will be mixed after the gas flow controller 10 and before the plane antenna 23. The gas introduced to the plasma processing chamber 1 will be exhausted through an exhaust valve by means of a vacuum pump 7. An exhaust valve 8 has a structure enabling the control of exhaust flow rate. In case of the oxide etching, a mixture of gases comprised of fluorocarbon gases including $C_5F_8$, $C_4F_6$, and $C_4F_4O$, inert gas (Ar) and oxygen, as well as carbon monoxide may be used for the etching gas. In the plasma processing chamber 1 an Al insert 22 anodized is provided. The insert may alternatively be made of SiC or alumina.

Then the plasma will be generated. DC current will be flew to a solenoid coil 4 for applying a magnetic field to the plasma processing chamber 1. A UHF high frequency power supply 17 will generate high frequency waves. A stub tuner 18 will perform impedance matching. The resonance of a dielectric substance of the antenna 28 with the plane antenna 23 will be used for introduce the high frequency waves into the plasma processing chamber 1 in a manner highly efficient. Thus introduced high frequency waves and the magnetic field of the coil will discharge in the vacuum of plasma processing chamber 1 to create plasma. The stub tuner 18 has a filter incorporated so as not to feed the high frequency waves from a high frequency wave power supply 12 for a processing stage 5 back to the UHF power source. In the drawings, the reference numeral 21 is designated to a yoke, the reference numeral 29 to a ground of the antenna.

Then, the high frequency wave power supply 12 will apply a high frequency wave bias to the wafer 6 through the Al electrode 27. Between the high frequency wave power supply 12 and the Al electrode 27 there are provided, in general, a matching device and a capacitor. The application of high frequency wave bias to the wafer 6 will promote the etching of the surface of wafer. A spectroscope 38 is provide for the measurement of light emission from the plasma, which is connected to the computer 113 through a line 37. An optical fibre cable 39 will connect between the plasma processing chamber 1 and the spectroscope 38 through a window 36 for the optical fibre.

FIG. 3 shows a gate processing unit in the etching equipment 105. Similar to FIG. 2, the wafer will be transported to the electrode 27 through a transporter gate valve 16. The etching gas will be introduced to a plasma processing chamber 1 (in this example, a gate processing chamber) through a dielectric substance 11 with a gas inlet port formed, after having the flow rate controlled by the gas flow controller 10. Appropriate electric current will be flew through a first solenoid coil 41 and to a second solenoid coil 42 to form a magnetic field. UHF waves from the UHF high frequency power supply 17 through the stub tuner 18 will be introduced to the plasma processing chamber 1, passing through an atmospheric antenna 34, quartz plate 33, and a dielectric substance 11 with a gas inlet port formed. The etching gas for the gate processing contains for example $Cl_2$, HBr, $O_2$, $CF_4$, $N_2$ and so on. The plasma processing chamber 1 is covered by a quartz vacuum chamber 13. The plasma will be generated by the UHF waves and the magnetic field. The application of high frequency waves from the high frequency wave power supply 12 for the processing stage to the wafer will promote the reaction of the radicals and ions in the plasma with the thin film on the wafer surface, thus the etching.

Now the first preferred embodiment will be described in greater details by way of example of the etching equipment. The computer 113 of the etching equipment is connected through a local line 109 to a private branch exchange 110 (PBX), then through a public line 111 to a computer 112 of the etching equipment manufacturer. The communication between the computer 113 and the computer 112 may be encrypted with a key code having more than 10 digits to restrict any interception by the third party. The key code itself is changed once a week, automatically.

Figure 4A:
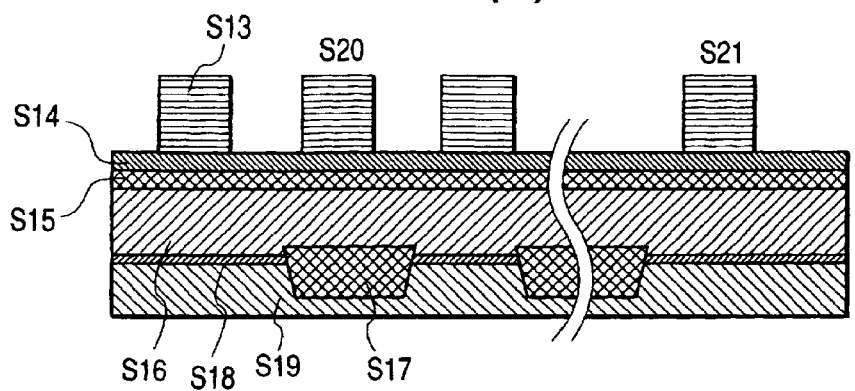
FIGS. 4(a) and 4(b) are schematic cross-sectional views of a gate electrode used in the present invention on a substrate to be processed before and after the process.

A wafer to be processed of the diameter of 300 millimeters will be fed to the line outlined above. Thin film structure on the wafer is shown in FIG. 4(a). On the silicon substrate S19 (wafer to be processed, referred to as the wafer hereinbelow) element isolation layer S17 has been formed, and p-type impurity has been implanted to form a thermal oxide layer S11 of thickness of 2.5 nanometers. The wafer has a polysilicon layer S16 of the thickness of 150 nm with impurity implanted, formed thereon by the polysilicon deposition equipment 101 and processed at the temperature of 500° C. by using di-silane gas. There are 25 wafers in one lot, and only the first wafer is sent to the thickness interferometer 102 to measure the film thickness.

Then the wafer will be washed and transported to the $SiO_2$ layer deposition equipment 103 to form an oxide layer S15 of thickness of 50 nm. Thereafter antireflection coating S14 and resist S13 will be applied thereon to transcribe a mask pattern to the resist by exposure equipment and to develop the pattern. After the development very fine line and space S20 and isolated line S21 will appear.

The wafer will be transported to a processing stage 6 in the plasma processing chamber 1 of the etching equipment 105 to etch the antireflection coating and the oxide layer. The gas used contains Ar, $C_5F_8$, and $O_2$. The selectivity with respect to the polysilicon layer S16 is approximately 50 thus the underlying polysilicon may resist to the over-etching of approximately 30%.

The resist and antireflection coating will be removed in the ashing chamber in the etching equipment 105. Thereafter, the wafer will be transported to the gate processing chamber, in which a gate electrode S16 (polysilicon) will be etched. For etching the gate a mixture of gases of $Cl_2$, HBr, and $O_2$ is used. The wafer thus etched will be transported to the next process, while the first one in the lot will be checked by the scanning electron microscope 106 for the inspection.

The thickness of polysilicon layer on the first wafer of the first lot is almost uniform, approximately 151 nm at the center of wafer, and 148 nm at the periphery. The distribution of polysilicon thickness will be automatically obtained by the computer 113 of the etching equipment through the network. More specifically, data for the interferometer is stored in the computer associated with the interferometer in order to allow search by lot numbers. The computer in the interferometer may also have an http server therein, through which the computer 113 may thus obtain the data on the computer in the interferometer. When a security measure is required for data transaction, encryption and the setting of access rights to the computer to connect may be implemented.

The data on the distribution of film thickness can be obtained by the computer 113 immediately after the measurement by referencing the schedule and process status stored on the line management computer 107.

For the etching conditions of polysilicon, the current flew through the first solenoid coils 41 and 42 will be adjusted so as to match with the distribution obtained. The adjustment will be performed before the lot will arrive. For example, the adjustment will be performed during the exposure and development of the lot in question. During the adjustment of etching conditions, the computer 113 may perform other etching processes with respect to wafers of other lots. Two or more computers 113 can be used for distributing the load.

The optimization of current in the coil depends on the subtile details of gas flow rate, gas pressure and power feeding. A certain level of accuracy is critical in the sense of reproducibility. Since a database concerning the coil conditions is established in the storage of the computer 113, the coil conditions will be determined by referring to the internal data. If an appropriate coil condition are not found, then data will be interpolated. Most of usual mass production can be performed at this level.

If the coil conditions are not yet determined or if the accuracy is not precisely defined, then the computer 112 of the fabrication equipment manufacturer will be accessed through a phone line. The computer 112 possesses a database used for developing a variety of etching processes, which database will be referred to for the definitive coil conditions. Alternatively, the latest database can be obtained from the fabrication equipment manufacturer. Or data may be available from a computer of other etching equipment in the line before connecting to the computer 112.

If the coil conditions are not still defined by using the computer 112, the process will be revised by using the etching equipment in the fabrication equipment manufacturer to add data to the computer 112. After addition, the computer 112 will transfer data to the computer 113. In order to accommodate with the mass production lines operative 24 hours a day, it is preferable to revise the process at more than two locations. For example, the fabrication equipment manufacturer can deploy the installations of process revision in Japan, Germany and U.S. west coast so as to be able to respond to the request from the computer 113.

The computer 113 will configure the current flew through the first solenoid coil 41 and the second solenoid coil 42 to 5.0 and 8.0 Amperes, respectively, such that the etching speed at the center of wafer is raised 2% from that at the periphery of the wafer. The fluctuation of thickness within a lot may be non-significant if the equipment is made for the mass production. If and only if fluctuation exists, the etching conditions can be modified by measuring the thickness for every wafer.

All wafers in the first lot will be processed in the same condition. In the gate etching process, the wafer will be etched in a condition having higher processability in the vertical direction (the main etching condition) immediately before the gate oxide appears, whereas the etching conditions will be switched to another condition having higher selectivity with respect to the gate oxide (over-etching condition) immediately after the gate oxide appears. Therefore, it is desirable that the moment (timing) that the gate oxide appears is at the same time in a wafer plane.

Figure 5:
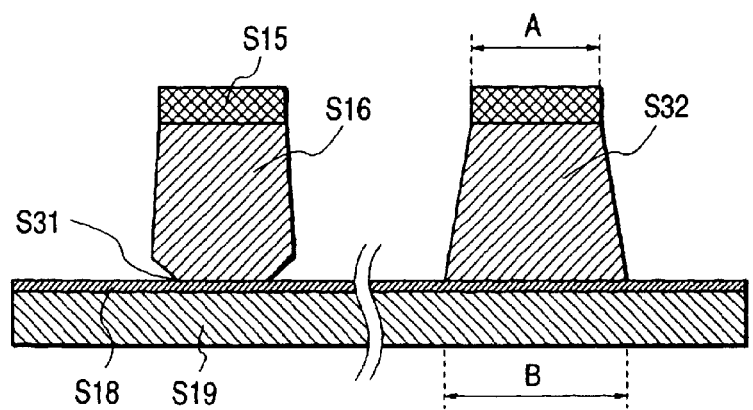
FIG. 5 is a schematic cross-sectional view of the definition of critical dimension of a gate electrode after the process.

With reference to the dimension shown in FIG. 5, the gate etching will be described here briefly. If there is inconsistency of etching speed or thickness in a wafer plane, in some part the gate oxide will be etched in the main etching condition so that the etching will be vertical but the gate oxide layer S18 will be totally removed in an extreme case. In other part the polysilicon will be etched in the over-etching condition. This may result in a tapered shape S32 as shown in FIG. 5 at the lobe of gate electrode. In other words, the scattering of etching speed or thickness of layers may cause the dispersion of the amount of CD (critical dimension) shift (which is one of processing shape controls). Also if there is a plurality of polysilicon layers of different amount of dosages on a wafer, a notch S31 as shown in FIG. 5 may be likely to appear in a polysilicon layer having a large amount of n-type dosage.

The tapered shape S32 may be indicated as the amount of CD shift. The CD shift is defined as the difference between the width B of the bottom of the polysilicon after etching process and the width A of the mask (oxide) S15 (i.e., B−A).

Figure 4B:
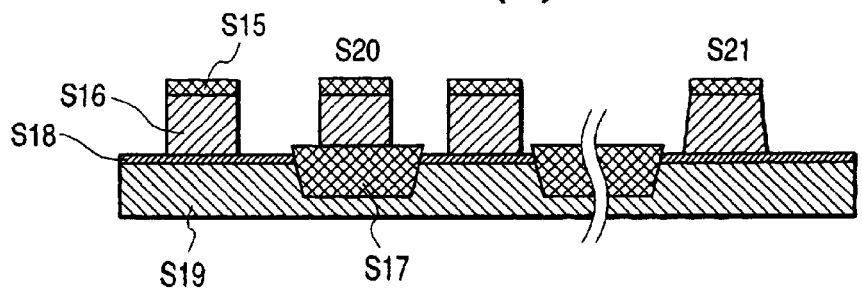

In accordance with the present invention, the etching speed will be controlled to have such a distribution that the timing of appearance of oxide will be approximately simultaneous in a wafer plane, so that the critical dimension of gate electrodes will become uniform over the wafer plane without removal of gate oxide by the etching process. The resulting dimension will be that shown in FIG. 4(b).

During processing the first lot, the current value flew through the coils will be determined for the second lot, in correspondence with the distribution of polysilicon, and so on.

The condition of the inner wall surface of the polysilicon deposition equipment may vary and the deposition rate at the periphery of wafers decelerates along with the increased number of wafers to be processed. At the 20th lot, the distribution of polysilicon deposition will be 151 nm/min at the center of wafer, and 155 nm/min at the periphery. The coil current will be adjusted accordingly to 5.5 A and 1.2 A, respectively. In this manner, a critical dimension will be stably obtained with a large number of wafers, up to 50th lot and the scattering of offset of the critical dimension from the mask, so-called CD shift, will be settled down within 3 nm, resulting in a critical dimension control in a range ±5% for the process of gate width of 30 nm.

In the prior method (distribution of etching speed is not controlled in accordance with the distribution of polysilicon thickness) the mismatch between the thickness distribution and the etching speed distribution causes a scattering of approximately 10 nm of CD shift.

[Second Embodiment]

Figure 6:
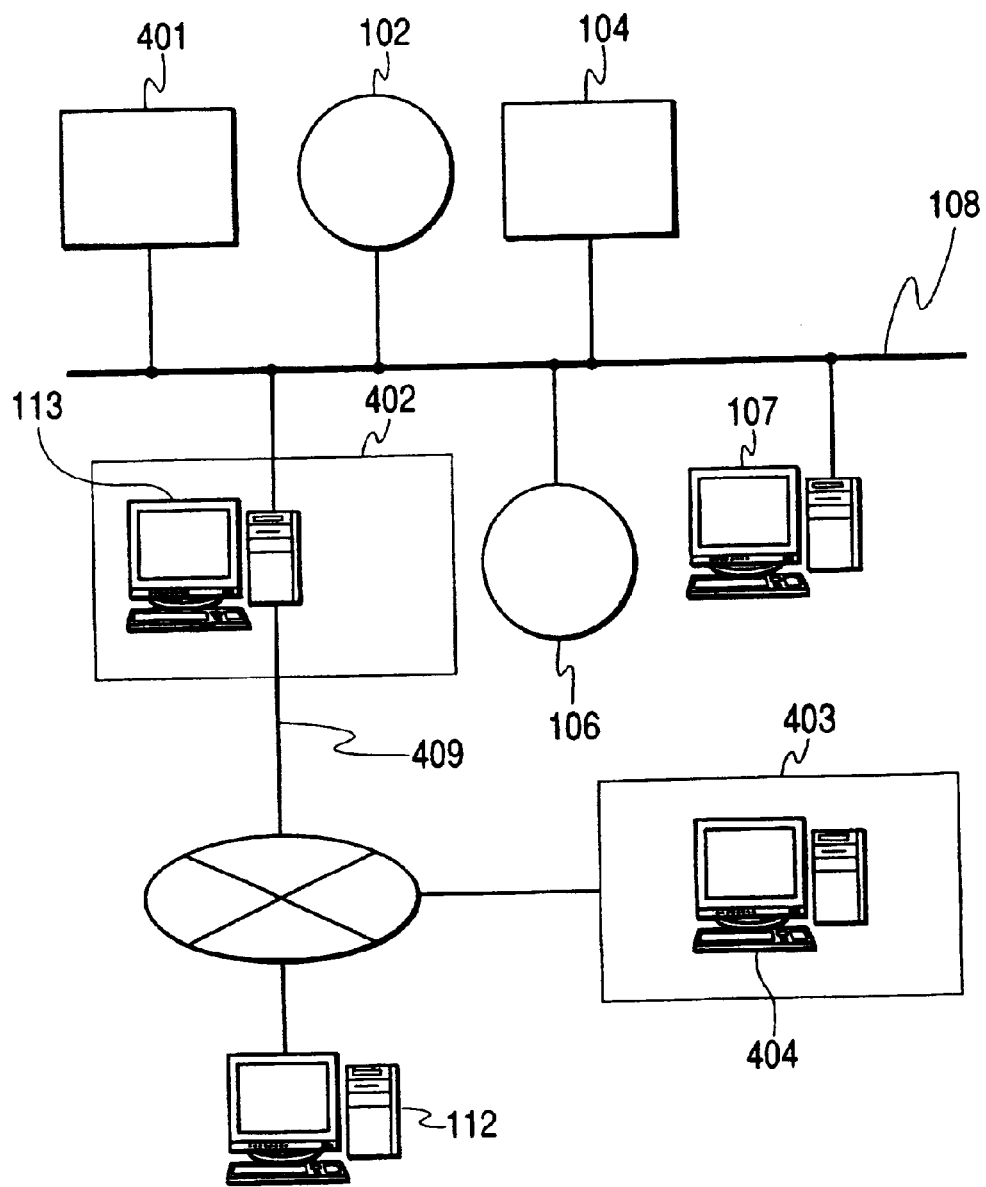
FIG. 6 is a schematic diagram of a network in another semiconductor device production line used in the present invention and the connection of the fabrication equipment to the outside.

Another preferred embodiment using the architecture shown in FIG. 6 in accordance with the present invention will be described in greater details herein below. In FIG. 6, part of a mass production line of semiconductor devices is shown. The wafer to be processed will be carried on a transporter robot and transported through silicone oxide deposition equipment 401, and exposure and development equipment 104 to etching equipment 402. In the etching equipment 402 an oxide processing unit shown in FIG. 2 is provided, associated with one ashing chamber and a computer 113 for controlling the equipment. After the deposition and etching, wafer will be transferred to the lavage. Part of wafers in a lot will be separately transferred to the thickness interferometer 102 and to the scanning electron microscope 106 for the inspection. The information on the mask (such as the surface area subject to be etched, thickness of oxide layer, thickness of mask, kinds of oxide, critical dimension and the like), processing history, lot number, processing schedule and the like are stored in the line management computer 107. Equipment in the line is TCP/IP connected on an Ethernet network 108 to enable data communication one with another. The lot number to be processed on these equipment may be indicated by the bar code on the case housing a plurality of wafers therein. The bar code will be automatically read out and entered to the computer incorporated in equipment, which in turn will communicate with the line management computer 107 to broadcast to every computers in the equipment of the line the information on the wafer history and so on. The line management computer 107 has its own schedule of lot processing, through which equipment in the line can obtain the information on a lot that is not arrived yet.

The preferred embodiment in accordance with the present invention will be described in the viewpoint of etching equipment. The computer 113 of the etching equipment is connected through another network 409, other than the Ethernet network 108, to the computer 112 of the etching equipment manufacturer. The etching equipment has an optical emission monitor installed for monitoring by the computer 113 during the etching. The computer 112 may also be connected to a computer 404 on other etching equipment 403.

Figure 7A:
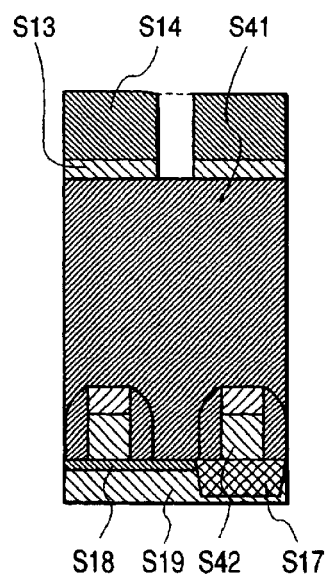
FIGS. 7(a), 7(b) and 7(c) are schematic cross-sectional views of the critical dimensions of a contact hole in the oxide layer used in the present invention on a substrate to be processed, before and after the process.

The production line shown in FIG. 6 is part of a semiconductor device production line, and the transistors are already formed on a wafer. A 8-inch wafer will be fed to this line. The wafer has an oxide layer of approximately 2000 nm deposited by the silicone oxide deposition equipment 401, and will have a hole pattern of 130 nm transferred to the resist by the exposure equipment, after application of the antireflection coating S14 and the resist. The wafer thus processed will be baked, and then the antireflection coating S14 will be etched prior to transporting to the etching equipment 402. The cross-sectional dimension of thus transported wafer will be as shown in FIG. 7(a). In the figure, reference numeral S41 is designated to an oxide, S42 to a gate electrode. Other reference numerals including S13, S14, S17 to S19 are identical to those of FIG. 4.

Figure 7B:
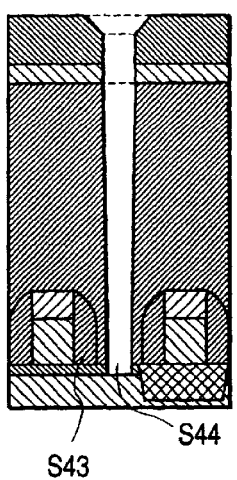

A mixture of gases of Ar at the gas flow rate of 1200 ml/min, $C_4F_6$ at the gas flow rate 25 ml/min, and $O_2$ at the gas flow rate of 36 ml/min will be introduced to the etching equipment and the UHF output power of 600 W, 450 MHz from the antenna will be emitted so as to apply to the wafer a high frequency waves of 2 MHz, 2000 W. The wafer will be cured for approximately three minutes to form contact holes. The processed shape after the etching will be as shown in FIG. 7(b). In the figure reference numeral S43 is designated to an oxide spacer, S44 to a contact hole.

The duration of etching may be determined based on the thickness measured by the thickness interferometer 102 for each lot. When 180 seconds of the duration of etching for the thickness of 2000 nm is set, and if the maximum thickness of the oxide layer may attain to 2100 nm, then the duration should be 189 seconds, an increase of 5%, or in case of 1900 nm, then the duration of etching should be 171 seconds. This allows a process to be complied with the dispersion in the deposition equipment. For instance, when the thickness is thicker than the control (for example, 2000 nm), the defects of semiconductor device caused by a contact hole not pierced through can be avoided.

As shown in the preceding preferred embodiment, a distribution of the etching speed can be configured in accordance with the thickness, based on the dispersion of the oxide thickness by means of the magnetic field control (current control of the solenoids). If the magnetic field is generated by the permanent magnets in the equipment, the distribution can be adjusted by tuning the position of permanent magnets. For equipment without a field, for example induction-coupling equipment that has two antennas (conductors) for the application of two or more of high frequency waves, the distribution of etching speed may be adjusted to match with the distribution of thickness by tuning the power distribution of high frequency wave with respect to those two antennas or by tuning the output balance of the power supply independently.

After etching, the resist and the antireflection coating on the wafer will be removed by ashing. Part of wafers thus processed will be sent to the scanning electron microscope 106 for the inspection (inspection SEM). The first wafer in a lot will be inspected by making use of the time while other wafers in the lot is being processed. The etching gas conditions may be, rather than those cited above, a mixture of Ar at the flow rate of 500 ml/min, $C_5F_8$ at the flow rate of 15 ml/min, and $O_2$ at the flow rate of 22 ml/min. The kinds of feeding gas may also include $C_6F_6$, $C_4F_8$, $C_2F_4$, $C_4F_6$ and so on, equivalently. The flow rate of Ar must be more than 200 ml/min.

The optical emission lines from the plasma during etching will be wavelength separated by a spectrometer to measure by a cooled CCD device. The optical intensities of emission lines originated from $C_2$ (approximately 516 nm) and that from O (approximately 777 nm) will be analyzed. After washing the equipment, the fluctuation of optical density along with the increased number of processing wafers will be monitored. The stronger the optical intensity of emission line $C_2$ may cause unopened openings, while stronger the optical intensity of emission line O may cause higher opening rate, at the cost of a reduced selectivity of the mask. Accordingly, the unopening will be monitored by the intensity ratio of $C_2$/O optical emission lines by considering the effect of reduction of noise.

Figure 7C:
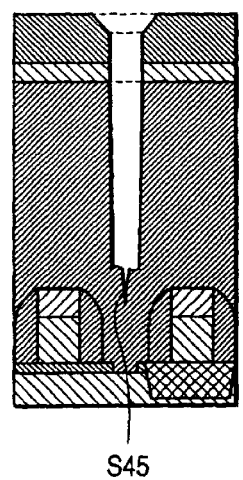

When the number of wafers processed is increased, the intensity of optical emission line of $C_2$ will increase accordingly due to the deposition to the innerwall surface. At approximately 3000 wafers, the intensity ratio of optical emission lines C2/O may increase by approximately 15%, gradually resulting in the unopening (under the condition that the processing time for a wafer is three minutes). The cross-section of the unopened processing shape will be as shown in FIG. 7(c). In the figure, reference numeral S45 is designated to an unopened hole.

At approximately same time, the deposit sticked on the inner wall surface will commence to peel off therefrom, developing particles that may cause an unopening. At approximately 2000 wafers or so (100 hours of operation), the 6 intensity ratio of optical emission lines C2/O will be increased by approximately 10%, when compared to the intensity ratio immediately after the lavage of the inside of the equipment.

Figure 8:
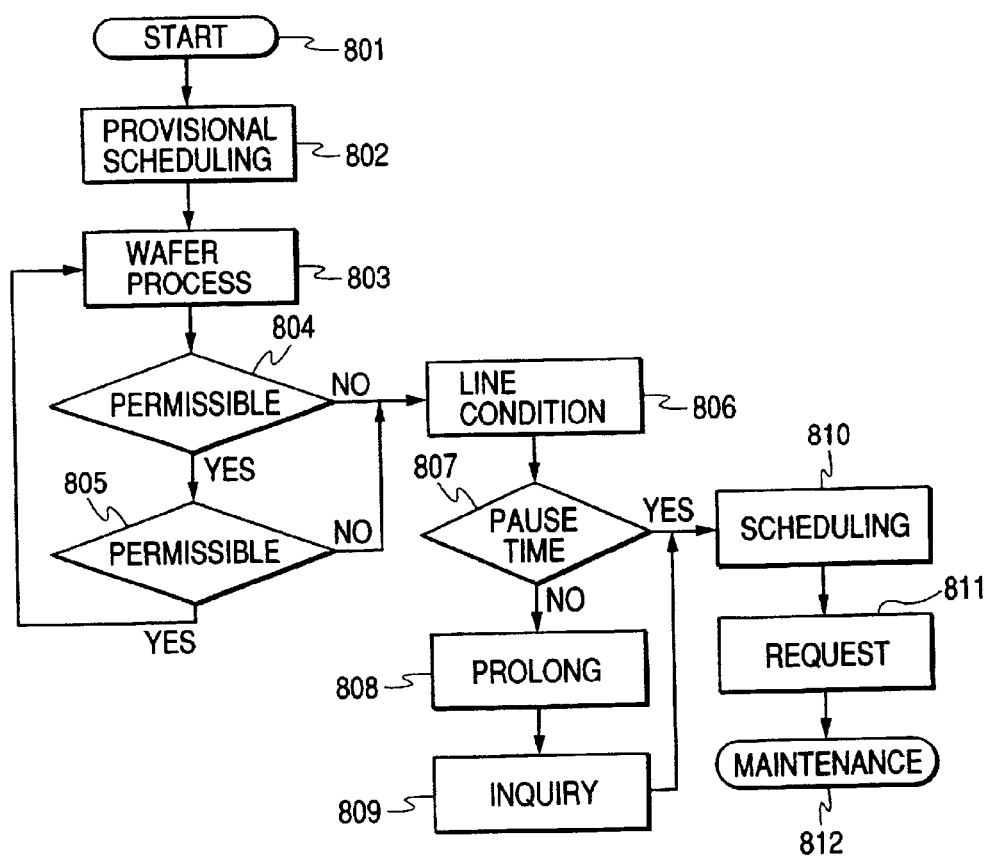
FIG. 8 is a flow chart illustrating the maintenance of the equipment used in the present invention.

After performing a maintenance of the equipment, the computer 113 in the equipment will access the line management computer 107 to obtain the processing status of the lots. The maintenance will be scheduled in the period from 100 to 120 hours of operation, based on the processing status of the lots to the line management computer. At the same time, the computer 113 will access the computer 112 of the fabrication equipment vendor (semiconductor device fabrication equipment manufacturer) to preliminary allocate the schedule. The flow of maintenance schedule is shown in FIG. 8.

The flow of the maintenance shown in FIG. 8 will be described in greater details herein below. The starting point is taken at the moment that the maintenance of equipment has been completed, or at the moment when equipment is newly installed. At the beginning of the flow, the etching equipment having the maintenance completed or the etching equipment newly installed will start running (step 80'). Thereafter, the maintenance schedule (timetable) of the etching equipment will be preliminary settled based on the averaged maintenance cycle derived from the case of processing continuously wafers (step 802). The averaged maintenance cycle can be determined from the total discharge time. Next, the etching process of wafers by the etching equipment will be operated (step 803). During etching, the optical emission spectra and the reflected waves of the power supply at one or more of predetermined wavelengths, opening angle of the variable valve (the exhaust valve for controlling the exhaust flow), the voltage of the high frequency wave and the like will be monitored. These monitored measurements will be supervised to determine whether the monitored measurements from the optical emission and high frequency wave is within a predefined range of regulation (step 804).

The total discharge time (the operating time after the start of the equipment (step 801)) will also be determined whether to exceed a given threshold time (step 805). If the monitored measurements and the total discharge time is within a predefined range (yes), then the next wafer will be processed (step 803). If otherwise either or both the monitored measurements and/or the total discharge time exceed the predefined threshold (no), then the computer will attempt to obtain the information on the schedule of the flow of incoming wafers on the semiconductor device production line (step 806). The schedule may be stored maintained on the line management computer in most cases.

Then, the computer will check to see whether there is a certain period of time (an enough duration of time in order to perform a maintenance) within few hours from that moment where no wafer is incoming to that etching equipment (pause time), in accordance with the schedule of the production line, or in other words, whether there is a sufficient time of non-operation for performing the maintenance of the etching equipment will be determined (step 807). If there is a sufficient pause time (yes), then the next maintenance to come will be scheduled to that time, and notify the administration of the production line or the administrative computer. This is the maintenance scheduling (settling the timetable) (step 810). Next, the maintainer of the equipment or the maintenance vendor will be asked to perform a maintenance (step 811). Thereafter the maintenance will be actually performed (step 812).

In step 807 where it is determined whether there is a sufficient pause time for the maintenance, if there is no such spare time (no), then the etching equipment will be supported with the cleaning or the adjustment of working conditions in order to prolong the operating time, at the cost of decreased throughput (step 808). Then the maintenance will be requested for the production line (step 809). The request for the production line is sent to the production line management computer to ask to see whether there is a spare time that the wafer processing is relatively less or an urgent process is present or absent. The maintenance timetable can be settled by asking the line manager. Then the maintenance will be scheduled (the schedule will be settled) (step 810).

After the maintenance, once the equipment starts operating, the maintenance schedule (timetable) of the etching equipment will be preliminary assigned (step 802) again, and the flow of FIG. 8 will be iterated.

when the intensity ratio is increased by 10% or more, after processing a sufficient number of wafers, the computer in the equipment will send a request of maintenance to the computer 112 of the vendor through the network. In parallel thereto, the computer in the equipment will ask the progress of the process of all lots and the maintenance schedule of the fabrication equipment up to the immediately preceding stage to the line management computer 107 that manages the lot schedule of the line. Based on the progress of the processing situation, the date and the time of maintenance scheduled for the etching equipment will be settled again. In normal operation, the maintenance will be performed as is preliminary settled, however the situation may vary according to the context where an urgent lot is jumped the queue, the deadline of semiconductor devices has been changed, and soon. The maintenance date to be scheduled is to be set at 4 to 48 hours after the moment when the intensity ratio of the optical emission spectra $C_2$/O is reached to 10% or more, and the maintenance schedule will be settled again to the longest period of time of inactivity on the interval between lots, where interval between two processing lots is more than one hour. In case in which there is awaiting a number of wafers to be processed on that equipment, and in which the maintenance cannot be settled within 48 hours, then the situation of wafer processing will be checked to see if there is a chance of setting the maintenance in the period between 48 hours and 96 hours. In this situation the maintenance schedule will be planned in the range of the period of time from 48 to 96 hours, at the point where the inactive pause duration is the longest. In parallel thereto, the computer will send the maintenance schedule to the computer 112 of the vendor and perform the measure to support to prolong the life of etching process.

In order to prolong the life of etching process, the source power (UHF output power) will be decreased. The optical emission intensity ratio of $C_2/o$ will increase in proportion to the source power, hence the intensity ratio may decrease when the source power is throttled down. The decreased output of the source power will improve the openability. After a lavage of equipment, if the UHF power is decreased by 40 W, the intensity ratio of the optical emission lines $C_2/O$ will be decreased by approximately 11%. When the etching equipment processes more wafers, the decreasing effect of the intensity ratio may be abridged because of the effect of the deposit sticked on the inner wall of the equipment. At approximately 2000 wafers processed, with a decrease of approximately 40 W of the power, the intensity ratio of the optical emission $C_2/O$ may decrease by about 9%. This indicates that after processing 2000 wafers (corresponding to approximately 100 hours of discharge), the openability can be maintained with a decrease of source power by 40 W.

When the source power is decreased by 40 W to yield 560 W, the plasma density will be reduced. This causes also a slight decrease of etching speed. An etching speed rated to 700 nm/min will decrease approximately 4% less, thus the etching time will have to be extended approximately 4%. In brief, the prolongation of the life of etching equipment will slightly degrade the throughput of the same.

Figure 9:
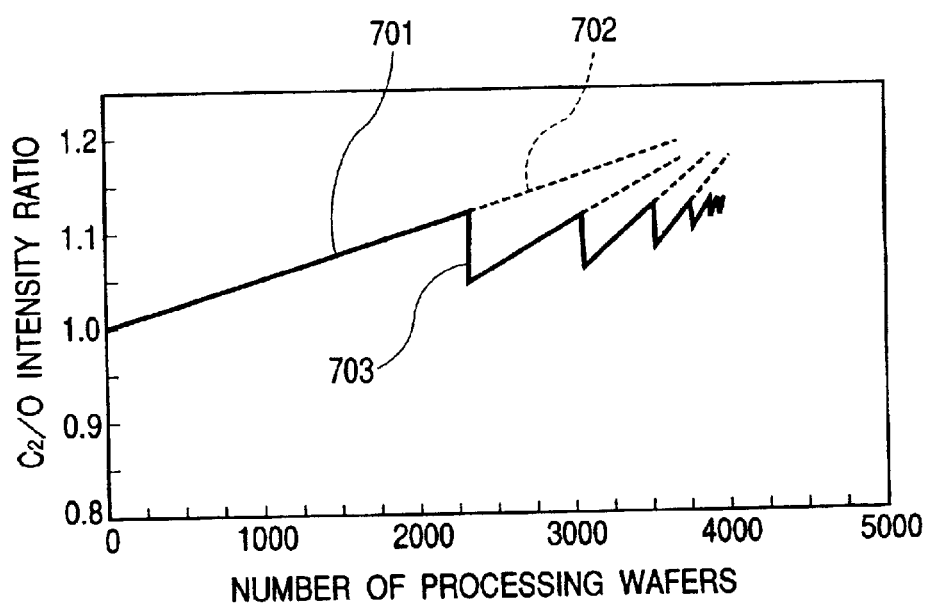
FIG. 9 is a graph illustrating the fluctuation in the long term running of the measurements of an optical emission monitor used in the present invention.

FIG. 9 shows a variation in time of the intensity ratio of the optical emission lines along with the prolongation measure taken. In the figure, reference numeral 701 is designated to the dependency of the intensity ratio of the optical emission to the number of wafer processed, reference numeral 702 is to the dependency of the intensity ratio of the optical emission to the number of wafer processed when the prolongation measure was not taken, the reference numeral 703 to a variation in time of the intensity ratio of the optical emission lines along with the modification of etching conditions.

As shown in FIG. 9, the decreased source power allows the intensity ratio of the optical emission lines to be smaller. However the deposit sticked to the inner wall surface may also affect thereto, so that the increment of the intensity ratio of the optical emission lines $C_2/O$ will be larger than that without the decrease of source power. As a result, when the intensity ratio of the optical emission lines $C_2/O$ exceeds the initial increase of 10%, if the source power is accordingly decreased by 40 W, then the process will be survived to approximately 3600 wafers, without onset of unopening. However it is preferable to limit the repetition of power down to three times or so since the effect of the prolongation measure becomes insignificant and the etching speed slows down thereafter due to the large amount of deposit sticked to the inner wall surface.

Another measure to prolong the life span is to clean the wall surface. This can be done by transporting dummy wafers, introducing a mixture gas of Ar at the gas flow rate of 1200 of ml/min, $C_4F_6$ at the gas flow rate of 10 ml/min, and ° 2 at the gas flow rate of 60 ml/min, and then discharging for 30 minutes. An alternative feeding gas condition may be a mixture of Ar at 400 ml/min, $C_5F_8$ at 10 ml/min, and $O_2$ at 50 ml/min.

The cleaning procedure will remove approximately 25% of deposit sticked to the inner wall surface to decrease the intensity ratio of the optical emission lines $C_2/O$. This ensures the openability. However excessive cleaning may cause part of deposit sticked to the inner wall to be completely removed and the inner wall itself to be scraped out to produce particles.

As can be seen from the foregoing description, a prolongation measure is effective when a number of wafer lots is congested and the adjustment of the maintenance schedule in correspondence with the lot processing context is effective for improving the substantial duty rate of operation of the equipment. In the lines of the Prior Art, a measure is adopted for periodically performing the maintenance at a regular interval basis by processing dummies for the discharge time management or for the particle monitoring. The present invention allows the substantial rate of operation to improve, and allows the throughput of the etching process in the semiconductor devices production to be improved by approximately 10 to 20%. In accordance with the present invention the maintenance schedule is automatically arranged to send instructions to the fabrication equipment manufacturer, allowing to facilitate the adjustment by the service engineer of the fabrication equipment manufacturer on site. This will mitigate the burden of the equipment manager in the semiconductor devices production line, and reduce or eliminate the personnel required for the maintenance as well. In addition, the refill or replacement of expendable supplies may be left to the fabrication equipment manufacturer. In accordance with the present invention, the total cost of the semiconductor devices production line can be significantly suppressed. When considering only the labor costs, approximately 20 million yens can be saved for one line.

In this preferred embodiment, a means for estimating the unopening based on the monitored optical emission lines is used. However there is an alternative using an inspection SEM as shown in the flow chart of FIG. 10. After etching, ashing and washing the first wafer of a lot, the wafer will be inspected by the inspection SEM to determine the rate of unopening. When the unopening rate becomes 20.0 ppb or more, then the computer in the etching equipment will reduce the UHF power by 40 W. At the same time the next maintenance will be scheduled in a manner similar to that as have been described above. This can reduce the development of defects caused by the unopening, resulting in an improved yield.

The flow chart shown in FIG. 10 will be described in greater details herein below. The starting point is taken at the moment when the maintenance of equipment has been completed, or at the moment when equipment is newly installed. At the beginning of the flow, the etching equipment having the maintenance completed or the etching equipment newly installed will start running (step A01). The etching equipment will be used to etch wafers (step A02). After the etching process, the wafers will be examined to detect the presence or absence of defective etching by inspecting the appearance or by means of any of nondestructive inspection methods (step A03). As exemplary inspection equipment a scanning electron microscope (SEM), or optical inspection equipment and the like may be used for inspecting the finished precision of critical dimension in the process, defects, number of particles and so on. Between the etching process and inspection process there may be one or more processes such as ashing, rinse, and the like.

If the wafer passes the inspection (yes), then the wafer will undergo the next process (step A02). If there is revealed by the inspection any defective caused by the etching (no), then a prolonging measure will be taken by cleaning the etching equipment or modifying the conditions, depending on the type of defects (step A04). If the defect is fatal, which cannot happen normally, equipment will be stopped to urgently perform 10 the maintenance. After a life-support measure is taken, the wafer process will be resumed within the range of reliability (which should be verified by the inspection). At the same time, the computer will attempt to obtain the information on the schedule of the flow of incoming wafers on the semiconductor device production line (step A05). The schedule may be stored and maintained on the line management computer in most cases.

Then, the computer will check to see whether there is a certain period of time (an enough duration of time in order to perform a maintenance) within few hours from that moment where no wafer is incoming to that etching equipment (pause time), in accordance with the schedule of the production line, or in other words, whether there is a sufficient time of non-operation for performing the maintenance of the etching equipment will be determined (step A06). If there is a sufficient pause time (yes), then the next maintenance to come will be scheduled to that time, and notify the administration of the production line or the administrative computer. This is the maintenance scheduling (settling the timetable) (step A07). Next, the maintainer of the equipment or the maintenance vendor will be asked to perform a maintenance (step A08). Thereafter, the maintenance will be actually performed (step A09).

In the decision step (A06) where it is determined whether there is a sufficient pause time for the maintenance, if there is no such spare time (no), then the etching equipment will be supported with the cleaning or the adjustment of working conditions in order to prolong the operating time (step A10). Then the production line will be requested for the maintenance (step A11). The request for the maintenance to the production line is sent to the computer in the production line to ask to see whether there is a spare time that the wafer processing is relatively less or an urgent process is present or absent. The maintenance schedule can be settled by asking the line manager. Then, the maintenance will be scheduled (the schedule will be settled) (step A07)

Figure 10:
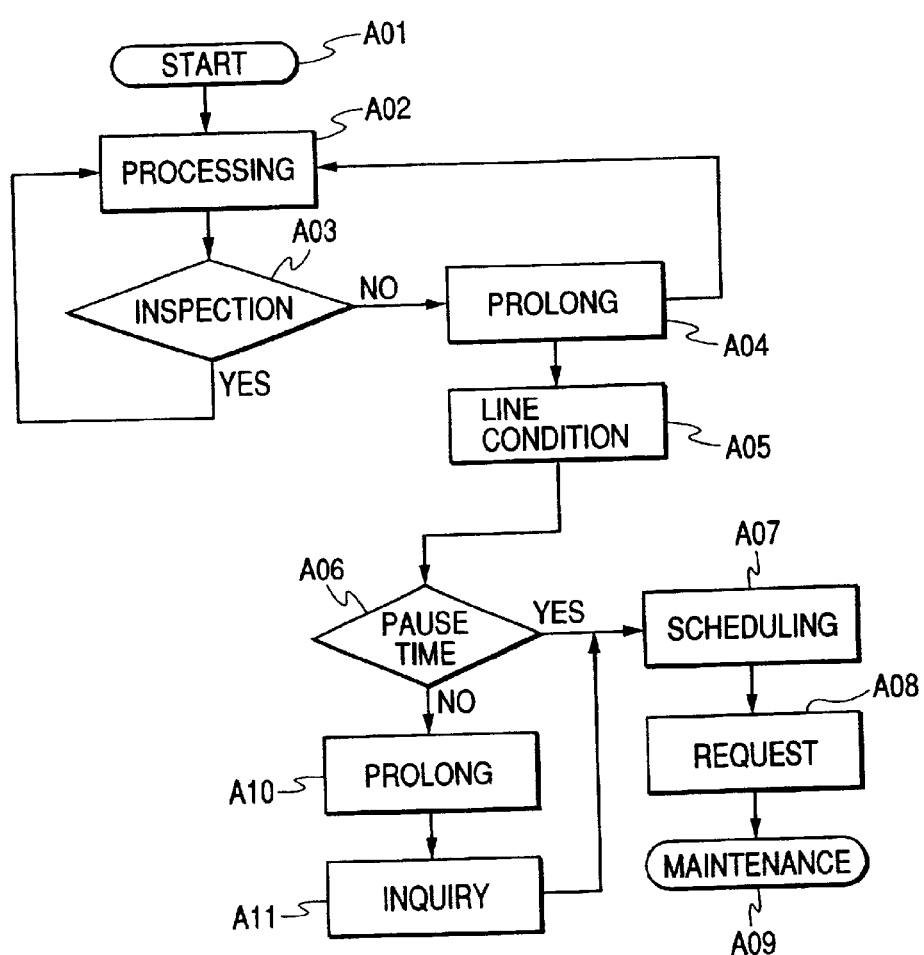
FIG. 10 is a flow chart illustrating the maintenance of the equipment by means of an inspection apparatus used in the present invention.

After the maintenance, once the equipment starts operating, the wafers will be etched as usual, and the flow of FIG. 10 will be iterated.

[Third Embodiment]

Figure 11:
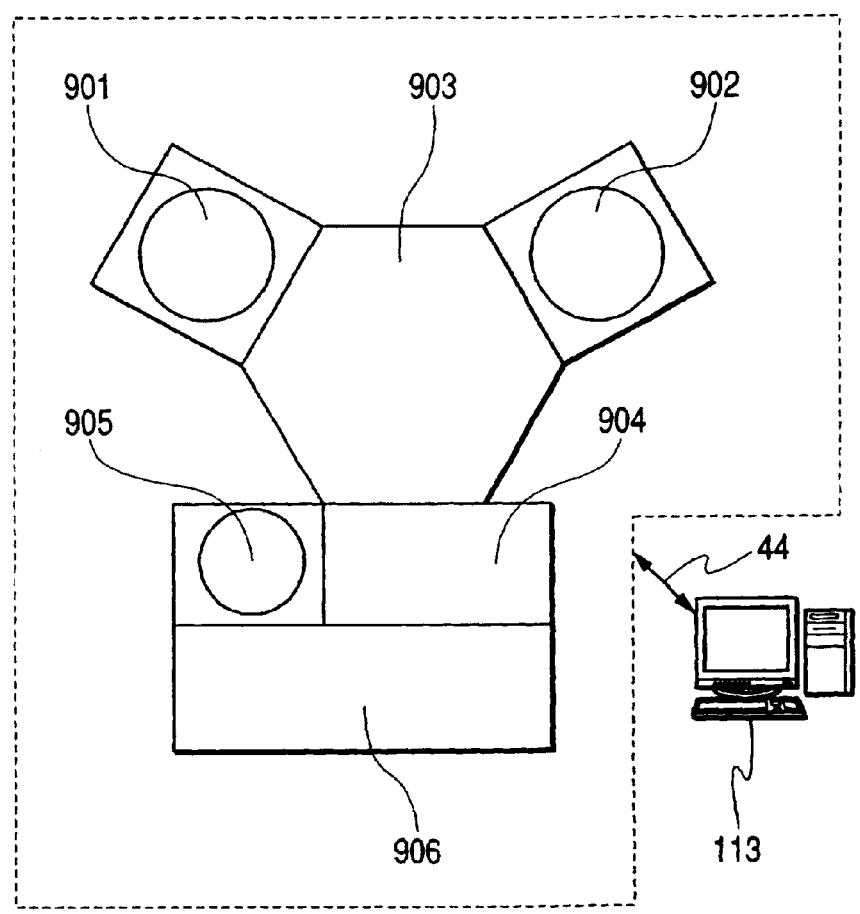
FIG. 11 is a schematic diagram illustrating the etching equipment (system) used in the present invention.

Yet another preferred embodiment of the present invention will be described in greater details with reference to the equipment shown in FIG. 11. The equipment shown in FIG. 11 includes etching chambers 901 and 902, a transport chamber 903, as well as a detector 905 associated with it. The etching chambers has the structure shown in FIG. 3. The detector emits slantwise light beams to the wafer surface and detects the intensity of reflected beam to determine the surface area to be etched. In the computer 113 of the etching equipment many deposition conditions that include input items with respect to the wafers having been processed and the etching conditions are stored and linked together. There is provided a database developed by the vendor in the computer, which database stores certain data including the surface area to be etched, amount of dosage, and annealing temperature. The database also contains the dependent data such as the gas flow rate, and gas pressure with respect to the critical dimension control (notches and CD shifts). Each item of data (of experiments) has the differential determined with respect to the critical dimension. More specifically, the differential values of the data includes the amount of CD shift, surface area ratio of the etched area to the CD bias between dense and isolated lines and the notch, amount of dosage, annealing temperature, HBR gas flow rate, $O_2$ gas flow rate, $Cl_2$ gas flow rate, gas pressures, UHF power output, wafer RF power, temperature of wafer electrodes, He gas pressure on the wafer backside, wafer radius and the like. The computer has the analytical software installed for deriving etching conditions from the database.

For the information on wafers, the computer in the equipment will automatically generate etching conditions including the gas flow rate, gas pressure, RF power, timings of step switching, etc., from the input data, such as the material of mask, method of mask deposition, surface area to be etched, structure (thickness) of the film to be etched, minimum pitch (line interval), kinds of feeding gas, name of depositing equipment, the concentration of impurity in the polysilicon, kind of impurity, dose method, temperature of deposition, annealing temperature, annealing time, and required accuracy of critical dimension (CD shift, and CD bias between dense and isolated lines).

The deposition conditions as have been described above can be otherwise obtained automatically from the lot management data registered to the line management computer of the appropriate line through the network. If the surface area to be etched is not available due to the security of the mask information, the surface area can be automatically set by measuring the surface area by means of a detector.

Figure 12:
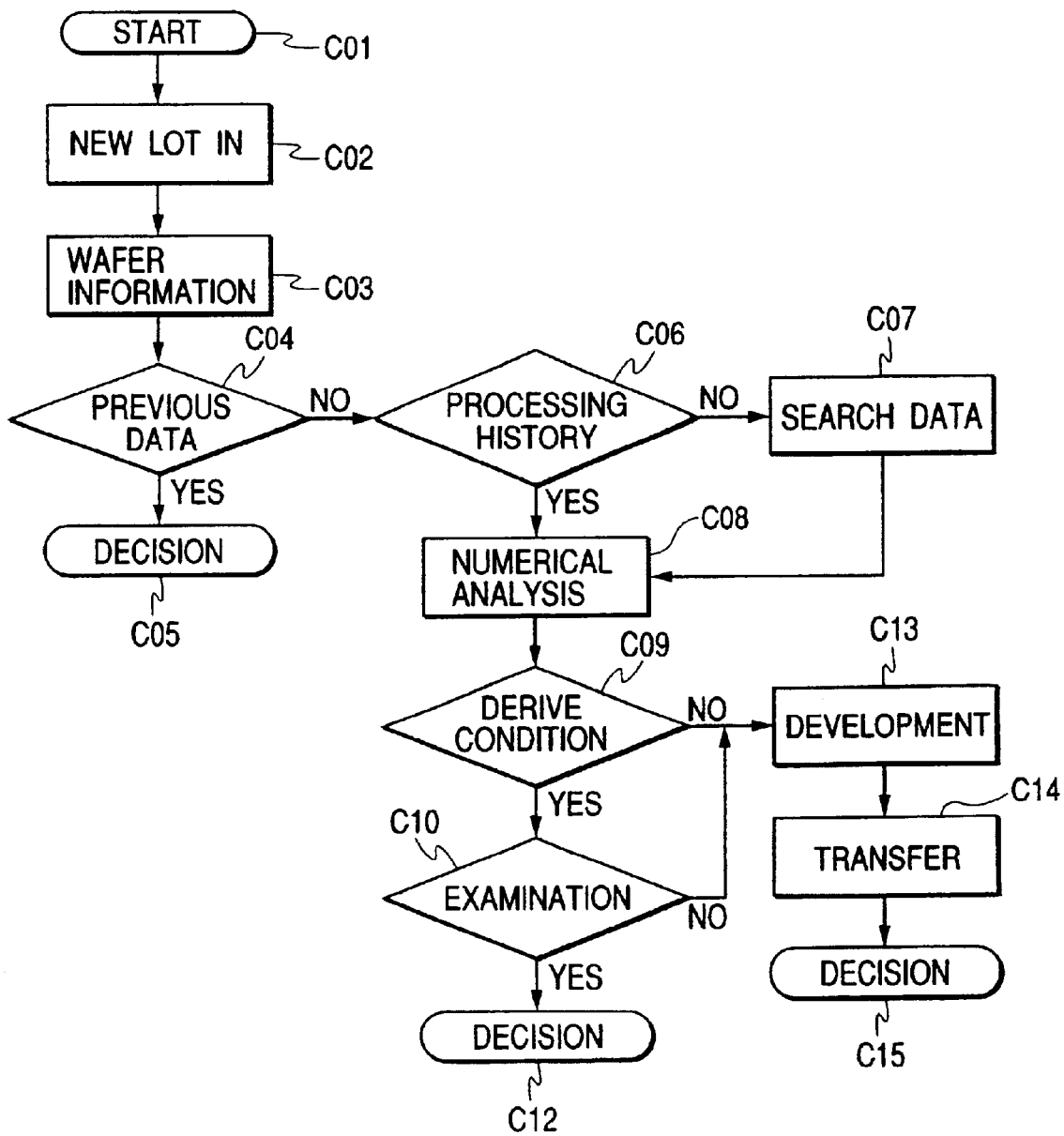
FIG. 12 is a flow chart illustrating the automatic generation of etching conditions used in the present invention.

The automatic generation of etching conditions will be performed in accordance with the flow shown in FIG. 12. The computer in the equipment stores the many deposition conditions that include input items with respect to the wafers having been processed and the etching conditions and links them together. In addition, etching conditions developed by the fabrication equipment manufacturer as well as the database with respect to the above-mentioned input conditions may also be stored. If an item input matches to an item that was input in the past (wafer specification, critical dimension control), then the latest input item of the etching conditions will be used for the current conditions. If only the critical dimension control is not matched, then the etching conditions will be derived based on the other matched items in the past conditions and the database. If the CD bias between dense and isolated lines is to be suppressed, then the conditions which may decrease the CD bias between dense and isolated lines and may not develop an undercut (notch) at the interface with the $SiO_2$ layer will be derived by referencing the past conditions.

The flow for generating the etching conditions as shown in FIG. 12 will be described in greater details below. A wafer will undergo certain processes since the arrival (step C02) of a new lot (product) before being processed by the etching equipment. The etching equipment in turn will generate the etching conditions based on the process steps of the incoming lot, the process history up to the immediate preceding step of the etching, and the inspection result. After obtaining the information on the production line with respect to the product wafer, the critical dimension control, and the required specification of etching (step C03), these items will be input into the computer of the etching equipment. The information on the production line indicates the process history of the wafer, the inspection result of the thickness of the layer to be etched, and the like, while the required specification of etching indicates the selection ratio of the mask, the uniformity of the critical dimension control, and the like.

Based on the wafer information, the computer in the etching equipment will search the stored data. The storage of the computer stores the etching conditions (recipes) that the equipment have processed in the past and the information of process history on the wafer, and the specification of the wafer as a database. Then the computer is used to search the past data to determine the presence or absence of the records with respect to the wafer to be processed (step C04). If the wafer information (process history, wafer specification, etc.) matches with the past data, the conditions of the past records will be selected for the current conditions. Thereafter the wafer will undergo the etching.

Next, if the profile is not matched with the past data (no), then it will be determined whether the wafer process history is the same as that processed in the past (step C06). The wafer process history used may include such items as the type of layer to be etched, the surface area to be etched, the material for the mask, the material for the underlying substrate, and the like. For any processes which do not affect the etching the history thereof can be ignored. If the process history matches (yes), then the required specification including critical dimension control or selection ratio will be different from the past data. If the process history does not match (no), then the computer will search in the database to extract conditions approximating the wafer specification and the process history of the wafer in the past (step C07). If data is insufficient for the search by the computer of the etching equipment, then the computer will search other databases on the computer that manages the etching process or the computer that is maintained by the fabrication equipment manufacturer to obtain information resembling to that of the wafer in question, facilitating to derive the etching conditions from a wider range of data.

Next, a numerical analysis will be performed based on the data found by the search (step C08). The numerical analysis will be performed on the computer. The analysis method used may include a numerical analysis containing experimental planning method, Taguchi method, etching process simulator and the like. Thereafter, it will be determined whether the etching conditions are completed by the numerical analysis (step C09). If the etching conditions are derived completely (yes), then these etching conditions can be used for the current process to etch the wafers. However, in this embodiment, the verification of critical dimension control after processing wafers (step C10) will be described below. Verification of critical dimension control may be performed by crushing the wafer to check to see the cross-section by means of the scanning electron microscope (SEM). However it is more preferable to verify the critical dimension control by means of non-destructive inspection equipment such as the measuring SEM.

If there is not a problem of the critical dimension control and the selection ratio (yes), then the etching conditions derived will be defined as the etching conditions of the current wafers (step C12). If the critical dimension control or the selection ratio does not satisfy the required specification (no), or if the etching conditions cannot be derived by the numerical analysis, then a new etching process will need to be developed step (step C13).

The development of an etching process is, in most cases, conducted in a development line, or on the equipment in the fabrication equipment manufacturer, rather than the production line. After an etching process is developed, the etching process thus developed will be transferred to the equipment in the production line (step C14). The communication network is a convenient means for transferring data. Data can be secured by encryption when transferring. After transferring data, the etching conditions will be decided (step C15), and wafers will be processed in accordance with those etching conditions. When a process is developed, the product wafer will not be etched during the development and the wafers having their own etching conditions already settled will be processed first. If a process has to be developed immediately after the arrival of a lot, a carpenter's scene may be played until the etching process will have been ready by processing the wafers of lower priorities.

The derivation method of etching conditions will be described. If there is data on the amount of notches, CD shift, CD bias between dense and isolated lines, selection ratio of $SiO_2$, etching speed, and data on the inclination with respect to each of these etching conditions, in the working conditions of the past, the conditions can be derived from that data, and if there is not an inclination, then the inclination can be determined by the method as described later. If CD bias between dense and isolated lines of the CD shift is 15 nm based on the data in the existing database, and the required CD bias between dense and isolated lines is 10 nm, then from the values and inclination of CD bias between dense and isolated lines with respect to the etching parameters such as the HBr gas flow rate, $Cl_2$ gas flow rate, $O_2$ gas flow rate, gas pressure, RF power and the like, the etching conditions will be derived which will be the CD bias between dense and isolated lines required for those parameters.

Figure 13:
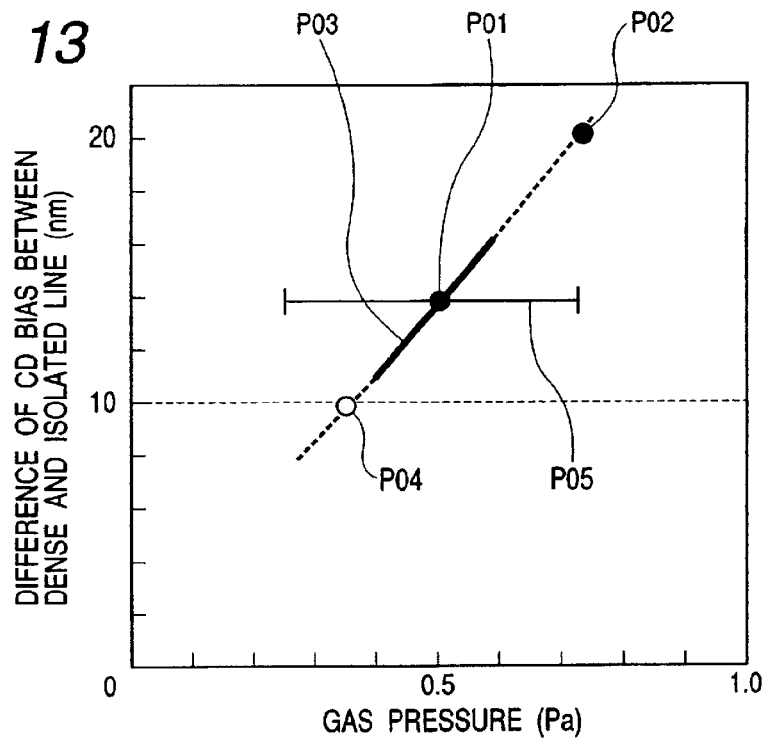
FIG. 13 is a graph illustrating a way of automatically generating the etching conditions used in the present invention.

For example, with respect to the gas pressure, as shown in FIG. 13, the inclination P03 of the CD bias between dense and isolated lines at the existing data P01 will be determined by the existing etching data P02 to derive the pressure at the point P04 which satisfies the requirement of the CD bias between dense and isolated lines. In the figure, P05 designates to the tolerance of the etching conditions determined.

The CD bias between dense and isolated lines 'x' at a new gas pressure P by linear approximation will be given by the following equation:

$$x=C(P-P0)+x0,$$

where C is the inclination of CD bias between dense and isolated lines with respect to the gas pressure, x0 is the CD bias between dense and isolated lines of that inclination, and P0 is the gas pressure in the existing etching conditions. Thus, $$P=(x-x0)/C+P0.$$

Other parameters will also be derived in a similar manner. As the CD bias between dense and isolated lines 'x0' is 14 nm, gas pressure is 0.5 Pa, inclination per 1 Pa is 30 nm, and x is 10 nm, the gas pressure will be 0.37 Pa.

The etching conditions thus determined may become a case impossible to realize on the given equipment structure. Therefore the upper and lower limits will be set for each of parameters. These limits may be defined by the exhaust performance of the equipment, the architecture of the power supply used, and the like. For instance, in the situation as have been described above, if the lower threshold of the gas pressure is 0.3 Pa, then x=0.37; however, if the lower threshold is 0.4 Pa because the exhaust performance is insufficient, then 'x' needs to be equal to 0.4. Or, if the inclination is extremely small, the estimation may be erroneous because the linear approximation does not fit. Therefore, a restriction needs to be applied to the shift from the existing conditions. For a parameter, there are in most cases experimental values in front and behind with respect to the parameter value for determining the inclination. A sufficient accuracy can be obtained in the range from ½ to 1.5 times of the existing conditions. The restricted range may be therefore more than ½ and less than 3/2 of the existing conditions. For example, in case of the gas pressure as have been described above, existing data is 0.5 Pa, the estimated range (P05) is 0.25 Pa to 0.75 Pa. The exhaust performance is limited to 0.3 Pa, then the range will be finally between 0.3 and 0.75 Pa.

For the derived conditions, the values such as $SiO_2$ selection ratio, notches, CD shift and the like will be estimated using the inclination. For instance, $SiO_2$ selection ratio 'y' can be calculated using the inclination of the selection ratio D and the existing data y0 by the following equation:

$$y=D(P-P0)+y0.$$

other parameters may be calculated in a similar manner.

In this way, etching conditions equal to the number of etching parameters will be derived. If among these etching conditions, there is one which matches to the critical dimension control requirement, this can be used for the real etching conditions. If two or more conditions are selected, then the most advantageous one will be further selected for the $SiO_2$ selection ratio, amount of notches, and CD shift. Whether advantageous or not can be determined if $SiO_2$ selection ratio is higher, and the notches and CD shift are less. The priority order of these parameters can be set independently, or compared after weighting the performance data-(CD shift and notches).

If by reducing the CD bias between dense and isolated lines, another performance is deviated from the requested specification, then new conditions will be derived again by using the inclination and the estimated value of the deviated performance. In this case there is not a precise inclination of the estimation, so that the inclination of the existing data will be diverted.

If the conditions is not still derived from the foregoing procedure, then the process will terminate as an error. The error message will be sent to the lot manager and the equipment engineers. This can be faced only when an extremely severe critical dimension control is requested, and will not happen in the usual mass production. Such errors encountered in the development course of a process of high critical dimension control will be removed prior to migrating to the mass production. When an error occurs, development of a new process is required. In such a case, as shown in FIG. 12, the error contents will be transferred to the fabrication equipment manufacturer (vendor) to ask them to solve the development.

Next, if there is not an inclination data, some conditions that have the wafer information records including the surface area to be etched, amount of dosage, annealing temperature and the like, resembled to the required wafer specification, will be selected to use the inclination therefrom. In most cases, the absolute values of notches and CD shifts may be different, while the inclination is not significantly varied. Thus errors may be prevented by setting appropriately upper and lower limits. How to select approximate specifications will be described later.

The cases that the wafer specification data is present have been described above. On contrary, if no existing data is present, data must be retrieved from the database.

The specification of which the surface area to be etched, dosage, annealing temperature and the like are approximate to the required specification of wafer will be selected. If wafer information that matches is found on the database, then the information will be used. If otherwise the information in the adjacent sets of data will be used.

The selection of adjacent set of data will be described by way of example of notches. In the following description, the inclination (sensitivity) of the surface area to be etched and the dosage with respect to the notches will be used for the sake of simplicity. In the following description, the mean of the absolute values of the inclination of the area to be etched is 'A', the mean of the absolute values of the inclination of the notches with respect to the dosage is 'B', the surface area to be etched of the processing wafer is 'x', dosage is 'y'. The inclination of experimental data points are used for the mean of inclination. When there is not an inclination in particular, by setting the lower limits to the mean of the absolute values, the conditions extremely different is not likely to be recognized as adjacent points.

The surface area to be etched is represented by 'u', dosage 'w' on the database. After defining the distance from the wafer information on the database to the process information of wafers, approximate conditions will be selected based on the distance. The distance 'd' may be defined by the following equation:

$$d=A^2(x-u)^2+B^2(y-w)^2+\ldots$$

By using this distance, every etching parameters with respect to the notches can be dealt equivalently.

Based on the distance above, data items adjacent in the database with respect to the notches, CD shift, and CD bias between dense and isolated lines will be picked up. In this example, the nearest data item (data point of minimum 'd') will be used.

The etching conditions that may satisfy the input critical dimension control will be selected on the just neighboring process data of the wafer. If there is not data that can satisfy the requirement, a data set that has the $SiO_2$ selection ratio at approximately the tolerance, and small CD shift, without notches will be selected at the top priority. This corresponds to the existing data point P01 of FIG. 14, with respect to nothces.

At first, wafer performance values of the most approximate point (notches and CD shift) as well as the inclination for the surface area to be etched, dosage, annealing temperature will be used for estimating the performance based on the difference from the surface area to be etched, dosage, annealing temperature of the processing wafer. This corresponds to the existing data point P06 of FIG. 14, with respect to nothces.

Figure 14:
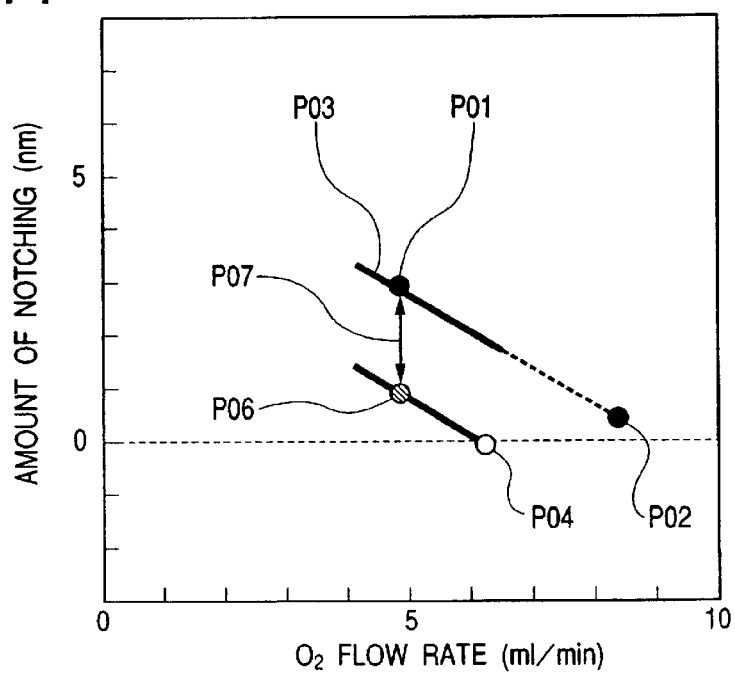
FIG. 14 is another graph illustrating another way of automatically generating the etching conditions used in the present invention.

The estimation method is a linear approximation in a manner similar to the case as have been described above. For example, when the difference is the surface area to be etched only, the amount of notches h may be given by $$h=(G-G0)/J+h0$$

where G0 is the surface area ratio of the data in the database, J is the inclination for the notches, h0 is the amount of notches, and G is the surface area ratio of the wafer to be processed. Other performance values may also be given by a similar manner. For the inclination with respect to the etching parameters the value at the most approximate point P01 will be used. The inclination in FIG. 14 is P03. In the figure, P07 is the difference of the amount of nothces between points P01 and P06.

The performance value in certain etching conditions along with the inclination with respect to the etching parameters thereof can be settled in this way. This can be used as the etching result in the past for deriving the most suitable etching conditions in a manner similar to the preceding case (although there is an experience, a higher accuracy of critical dimension control is required). If no notch is specified by the requirement then the etching conditions will be the point corresponding to P04 of FIG. 14.

Although the etching conditions thus derived can be used as is, the etching shape may be verified for new wafers. The verification allows new etching conditions to be derived in accordance with the procedure as have been described above, by adding the data to the database, if the shape is different from the one desired. This will improve the accuracy of the database, simultaneously.

To this equipment, a wafer of diameter of 200 mm will be transported. A polysilicon layer of the thickness of 200 nm is deposited on the wafer, and a silicon nitride film thereon will have patterns formed. The surface area to be etched will be 70%, the impurity for the polysilicon will be P, of which the concentration will be $10^{19}/cm^3$, the deposition temperature and annealing temperature will be 600° C. The minimal critical dimension control will be 100 nm. After these data items will have been input to the computer 113, the critical dimension control will be entered. The dense CD shift less than 10 nm, CD bias between dense and isolated lines less than 20 nm, nothcing 0, etching speed 100 rim/min or over, $SiO_2$ selection ratio more than 100. The wafer of this specification will be refered to as the type "A".

As this wafer has a record in the past, the conditions in the past will be selected. The main etching conditions will include the gas flow rates of 70 ml/min for HBr, 20 ml/min for $Cl_2$, 4 ml/min for $O_2$, gas pressure of 0.4 Pa, UHF power of 500 W, wafer bias power 50 W. Conditions will be changed by the over-etching to the gas flow rates of 100 ml/min for HBr, 5 ml/min for $O_2$, and gas pressure of 1.6 Pa. The critical dimension control will be approximately that shown in FIG. 4(b).

Then, an etching will be performed for a wafer with a different dosage of $10^{21}/cm^3$ The etching conditions will be automatically generated based on the data in the database (etching as have been described above). The etching conditions will differ from the above conditions, in that for the main etching conditions, the gas flow rates for HBr, $Cl_2$, and $O_2$ of 60, 40, and 5 ml/min respectively, for the over-etching conditions the gas flow rates for HBr and $O_2$ of 100 and 7 ml/min respectively, and gas pressure of 1.2 Pa. The CD shift in the automatic setting will be approximately 9.5 nm with no notching, and the $SiO_2$ selection ratio at the over-etching conditions will be approximately 130.

When the surface area to be etched for the wafer A becomes 60%, then the $O_2$ flow rate in the main etching conditions will be 3.5 ml/min, and the $O_2$ flow rate in the over-etching conditions will be 4.5 ml/min.

When the annealing temperature for the wafer A becomes 400° C., then the gas flow rates of HBr and $Cl_2$ will be 80 and 20 ml/min, respectively.

When the CD bias between dense and isolated lines of CD shift for the wafer A is less than 15 nm, the gas pressure for the main etching conditions will be 0.32 Pa, the gas pressure for the over-etching conditions 1.2 Pa, $O_2$ flow rate of 6 ml/min.

When the wafer diameter of the wafer A is 300 mm, based on the comparison between data for 200 mm and data for 300 mm in different wafer specifications, the gas flow rate for both the main and over-etchings will be 1.4 times, UHF power of 1.7, and wafer bias of 2. The critical dimension control will be approximately the same as the wafer diameter of 200 mm.

As can be appreciated from the foregoing description, once given a wafer specification, etching conditions corresponding thereto may-be automatically determined so as to facilitate fine and precise etching. In the conventional LSI production of small amount and variety products fine etching of old, degenerated, obsolete critical dimension control was used in order to avoid the optimization of etching conditions for each of products, at the cost of the fine critical dimension control. Or fine etching for each product was optimized if and only if the cost or duration of development period has not an important priority.

In contrast to the conventional scheme above, in accordance with the present invention, etching conditions corresponding to a wafer specification can be generated automatically. The etching process at the cutting edge of technology (in terms of fineness and critical dimension control) will be provided even for a semiconductor device production of small amount and variety products, with lower cost and shorten period of production.

Although in the above description, etching of the polysilicon gate electrode has been cited, the present invention may also provide the automatic generation of etching conditions not only for the polysilicon gate electrode, but also for other structures, including W/WN/polysilicon, silicide (Co/polysilicon) as well.

Since the present invention may provide the automatic generation of etching conditions based on the database, equally effective for the silicon substrate processing (STI etching, trench etching), oxide etching, and organic film etching, allowing to lowr the development cost of the etching process and to save the time for developing semiconductor devices.

As can be appreciated from the foregoing description, etching conditions may be derived based on a database. However if a quantitative modeling (simulation) is available for the relation between etching conditions and wafer specifications as well as the critical dimension control, the generation of etching conditions will be significantly simplified to improve the efficiency. It is important that the modeling matches well with the experimental data. In particular, modeling is error-free and highly precise, while on the other hand the database may be comprised of erroneous data. Modeling allows the estimation of critical dimension control based on the equations for both known and unknown etching conditions or wafer specification. Thus, the etching conditions may be automatically generated by modeling computation in a manner similar to that using a database.

[Fourth Embodiment]

Figure 15:
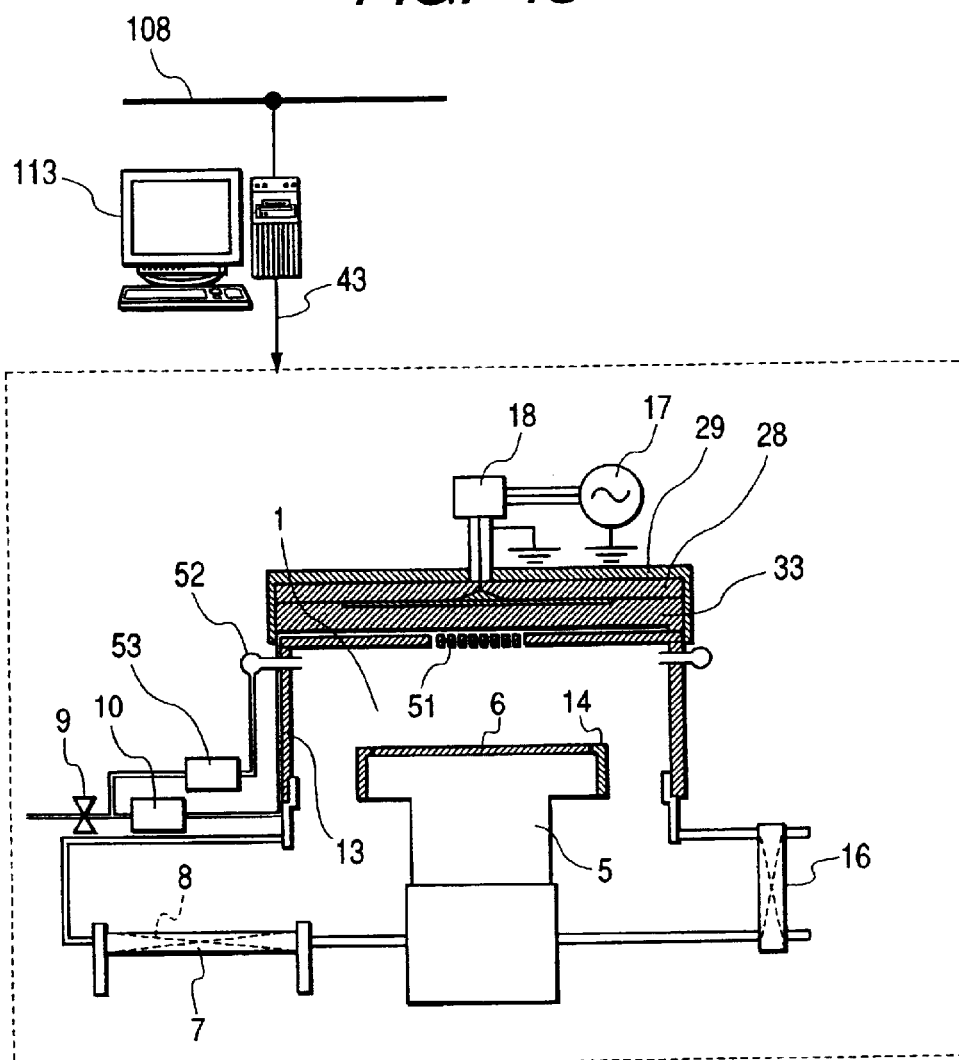
FIG. 15 is a schematic diagram of a cross-sectional view of deposition equipment used in the present invention and the connection thereof to a management computer.

CVD (chemical vapor deposition) equipment shown in FIG. 15 will be used for the description of polysilicon depositon. The CVD equipment shown corresponds to the polysilicon deposition equipment 101 of FIG. 1, assosiated with a thickness interferometer 102. P-doped polysilicon layer will be formed on a silicon wafer that has gate oxide layer and element isolation layer deposited on the surface. A wafer of diameter of 200 mm will be carried in to the equipment, then processed in the condition of deposition temperature 530° C., gas flow rates of SiH4 at 1000 ml/min, $PH_3$3 at 40 ml/min, gas pressure 70 Pa, UHF power 200 W, and duration 120 seconds. The feeding gas will be introduced from the conductance valve 9 through the gas flow controller 10 and 53 for controlling the flow rate, and through both center nozzles 51 and peripheral nozzles 52 into the chamber. On the wafer surface plane a polysilicon film of approximately 60 nm will be deposited.

With the increase of the number of wafers to be processed, deposit on the inner wall surface of the equipment increases. As a by-product H (hydrogen) will be emitted from the inner wall surface so as to deccelerate the depositing speed at the periphery. The first wafer of every lots will be used for the thickness measurement.

After washing the equipment, when 40% of gas is introduced from the center nozzles 51 and 60% from the peripheral nozzles 52, the thickness distribution will be almost plane for approximately 200 wafers of processing. However, at approximately 400 wafers or so, the film thickness at the periphery will be thinner, by approximately 10%, to approximately 55 nm, when compared with the thickness at the wafer center. Accordingly the equipment needs cleaning for approximately 400 wafers of processing.

The thickness interferometer and CVD equipment is connected by the Ethernet network 108 such that the computer in the CVD may obtain the measurement result automatically. The data on the flow rate of the gas introduced through the center and peripheral nozzles in the processing chamber of the CVD equipment in relation to the thickness distribution, is stored as a database in the computer. Based on the thickness measurement result, the computer is programmed so as to adjust the feeding gas flow rate of the gas introduced through each nozzle.

For initial processing of wafer, the distribution of thickness will be almost uniform with 40% of gas through the center nozzles and 60% of gas through the peripheral nozzles. For each 2% decrease of peripheral thickness with respect to the center thickness, the feeding gas flow rate through the center nozzles will be reduced by 1%. At 200 wafers of processing, the feeding gas through the center nozzles will become approximately 35%, allowing the thickness uniformity to be maintained. A uniform thickness distribution may be obtained for approximately 1000 wafers.

Feedback of the result of thickness measurement to the CVD allows the frequency of lavage of the equipment to be prolonged, with improved throughput of the semiconductor devices.

In a similar manner to etching equipment, by connecting the computer equipped in the fabrication equipment to the fabrication equipment manufacturer and monitoring them, the personel required for the maintenance in the semiconductor devices production line may be unnecessary. The rate of operation may be improved by scheduling the maintenance (lavage) in accordance with the wafer processing situation.

In the semiconductor devices production of small amount and variety products, the production period will be shortened with the cost lowered. The maintenance of the semiconductor devices fabrication equipment performed by the fabrication equipment manufacturer allows labor cost on the semiconductor devices production line to be reduced.

In addition, the feedback of data obtained by the monitoring or inspecting equipment to the fabrication equipment may reduce the defects (for example, defective contacts) caused by the process, to improve the yield of the semiconductor devices produced. Since the timing of maintenance including the lavage of equipment, refill and replacement of expendable supplies can be set to accommodate the scheduled duty of the production line, the rate of operation of the equipment will be increased, with the throughput of semiconductor devices improved. Simultaneously, by notifying the fabrication equipment manufacturer of the schedule of maintenance, the maintenance will be performed on site by the engineer sent by the fabrication equipment manufacturer. This may eliminate the need of dispatching the personel for maintenance to the semiconductor devices production lines, allowing labor cost of the production line to be saved.

In accordance with the present invention, a method of manufacturing a semiconductor device and manufacturing may be achieved, which allows the automatic generation of processing conditions in the semiconductor devices production, by using a database or modeling, based on the processing history of preprocess of the wafer in question, and which allows the yield and throughput to be improved by performing the unified management of lines through the communication lines including the matching among fabrication equipment.

In case in which the definitive processing conditions is not determined, the optimization of process conditions will be readily supported by the fabrication equipment manufacturers. This may result in a lower cost of process development and a fabrication of semiconductor devices in shorter period in the semiconductor devices mass production of small amount and variety products.

The present invention may be embodied in other specific forms and may be effective in general in the semiconductor devices fabrication equipment, without departing from the spirit or essential characteristics thereof. For instance, a dry etching process may be readily affected by its preceding process, and may readily develop the fluctuations in the long-term running. Accordingly the present invention has the most prominent effect in the etching process.

It is further understood by those skilled in the art that the foregoing description is preferred embodiments of the disclosed device and that various changes and modifications may be made in the invention without departing from the spirit and scope thereof.

What is claimed is:

1. A method of manufacturing a semiconductor device, comprising the steps of:

recording into a computer readable recording medium, a deposition condition and mask information of other production steps performed prior to one production step of production steps in a semiconductor device manufacturing process; and determining automatically processing conditions in said one production step based on said deposition condition and mask information recorded in said computer readable recording medium, wherein said one production step includes an etching step for subjecting semiconductor wafers to a dry etching by plasma, wherein conditions for the dry etching are determined based on a surface area to be etched, and wherein the method further includes the step of measuring the surface area to be etched to provide a measured surface area, said measured surface area being used in determining the conditions for the dry etching.

2. A method of manufacturing a semiconductor device according to claim 1, wherein said steps are performed by at least one computer, and said at least one computer is connected to another computer at a fabrication equipment manufacturer through a communication network, to obtain information supporting the conditions for the dry etching.

3. A method of manufacturing a semiconductor device, comprising the steps of:

connecting a plurality of fabrication equipments, including an etching equipment, used in a manufacturing process of semiconductor devices, through a communication network to at least one computer;

recording on said at least one computer a deposition condition and mask information of other production steps performed prior to one production step of production steps in said manufacturing process of semiconductor devices, wherein said one production step includes an etching step for subjecting semiconductor wafers to a dry etching by plasma; and determining automatically processing conditions in said one production step based on said deposition condition and mask information recorded in said at least one computer, wherein conditions for the dry etching are determined based on a surface area to be etched, and wherein the method further includes the step of measuring a surface area to be etched to provide a measured surface area, said measured surface area being used in determining the conditions for the dry etching.

4. A method of manufacturing a semiconductor device according to claim 3, wherein said at least one computer is connected to another computer at a fabrication equipment manufacturer through a communication network, to obtain information supporting the conditions for the dry etching.

5. A manufacturing system of a semiconductor device, comprising:

a plasma processing equipment for subjecting a semiconductor wafer to a dry etching by plasma in a processing chamber held in a vacuum state by generating plasma from a feeding gas introduced into said processing chamber; and a first computer associated with said plasma processing equipment, operatively connected to a second computer associated with other processing equipment through a communication network, for recording a deposition condition and mask information of other production steps performed prior to one production step of production steps in a manufacturing process of semiconductor devices, wherein conditions for the dry etching are determined based on a surface area to be etched, and wherein the system further includes a device that measures a surface area to be etched to provide a measured surface area, said measured surface area being used in determining the conditions for dry etching.

6. A manufacturing system of a semiconductor device according to claim 5, wherein said first computer associated with said plasma processing equipment is operatively connected to a third computer at a fabrication equipment manufacturer through another communication network, to obtain information supporting the conditions for the dry etching.

* * * * *